United States Patent
Yamazaki et al.

(10) Patent No.: US 6,890,784 B2
(45) Date of Patent: May 10, 2005

(54) SEMICONDUCTOR DEVICE AND PROCESS FOR PRODUCTION THEREOF

(75) Inventors: Shunpei Yamazaki, Tokyo (JP); Jun Koyama, Kanagawa (JP); Hiroshi Shibata, Kanagawa (JP); Takeshi Fukunaga, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 1 day.

(21) Appl. No.: 10/453,034

(22) Filed: Jun. 3, 2003

(65) Prior Publication Data

US 2004/0065882 A1 Apr. 8, 2004

Related U.S. Application Data

(62) Division of application No. 09/487,432, filed on Jan. 19, 2000, now Pat. No. 6,590,229.

(30) Foreign Application Priority Data

Jan. 21, 1999 (JP) .......................................... 11-013275

(51) Int. Cl.$^7$ .............................................. H01L 21/00
(52) U.S. Cl. ........................ 438/30; 438/149; 438/150; 438/155; 257/E33.07; 257/E29.151
(58) Field of Search .............................. 438/23, 29, 30, 438/149, 150, 152, 155, FOR 201; 257/E33.07, E29.151

(56) References Cited

U.S. PATENT DOCUMENTS

| 4,409,724 A | 10/1983 | Tasch, Jr. et al. |
| 4,823,180 A | 4/1989 | Wieder et al. |
| 4,851,370 A | 7/1989 | Doklan et al. |

(Continued)

FOREIGN PATENT DOCUMENTS

| EP | 0 544 229 | 6/1993 |
| EP | 0 862 077 | 9/1998 |
| JP | 3-280018 | 12/1991 |
| JP | 4-219736 | 8/1992 |
| JP | 5-034718 | 2/1993 |
| JP | 7-130652 | 5/1995 |
| JP | 7-130974 | 5/1995 |
| JP | 7-135323 | 5/1995 |
| JP | 7-169974 | 7/1995 |
| JP | 7-169975 | 7/1995 |
| JP | 7-209672 | 8/1995 |
| JP | 7-218932 | 8/1995 |
| JP | 7-321339 | 12/1995 |
| JP | 8-078329 | 3/1996 |

(Continued)

OTHER PUBLICATIONS

European Patent Office Search Report Application No. 00101189.9–2203 dated May 28, 2004.

(Continued)

*Primary Examiner*—George Fourson
*Assistant Examiner*—Thanh V Pham
(74) *Attorney, Agent, or Firm*—Cook, Alex, McFarron, Manzo, Cummings & Mehler, Ltd.

(57) ABSTRACT

Disclosed herein is a semiconductor device with high reliability which has TFT of adequate structure arranged according to the circuit performance required. The semiconductor has the driving circuit and the pixel portion on the same substrate. It is characterized in that the storage capacitance is formed between the first electrode formed on the same layer as the light blocking film and the second electrode formed from a semiconductor film of the same composition as the drain region, and the first base insulating film is removed at the part of the storage capacitance so that the second base insulating film is used as the dielectric of the storage capacitance. This structure provides a large storage capacitance in a small area.

7 Claims, 22 Drawing Sheets

DRIVING CIRCUIT PORTION          PIXEL PORTION

U.S. PATENT DOCUMENTS

| | | | |
|---|---|---|---|
| 4,886,962 | A | 12/1989 | Gofuku et al. |
| 5,162,933 | A * | 11/1992 | Kakuda et al. ............... 349/46 |
| 5,292,675 | A | 3/1994 | Codama |
| 5,343,066 | A | 8/1994 | Okamoto et al. |
| 5,365,079 | A | 11/1994 | Kodaira et al. |
| 5,508,209 | A | 4/1996 | Zhang et al. |
| 5,563,427 | A | 10/1996 | Yudasaka et al. |
| 5,594,569 | A | 1/1997 | Konuma et al. |
| 5,608,251 | A | 3/1997 | Konuma et al. |
| 5,616,935 | A | 4/1997 | Koyama et al. |
| 5,620,905 | A | 4/1997 | Konuma et al. |
| 5,643,826 | A | 7/1997 | Ohtani et al. |
| 5,671,027 | A | 9/1997 | Sasano et al. |
| 5,814,529 | A | 9/1998 | Zhang |
| 5,847,432 | A | 12/1998 | Nozaki |
| 5,882,960 | A | 3/1999 | Zhang et al. |
| 5,895,933 | A | 4/1999 | Zhang et al. |
| 5,923,962 | A | 7/1999 | Ohtani et al. |
| 5,966,193 | A | 10/1999 | Zhang et al. |
| 6,066,860 | A | 5/2000 | Katayama et al. |
| 6,077,731 | A | 6/2000 | Yamazaki et al. |
| 6,147,667 | A | 11/2000 | Yamazaki et al. |
| 6,166,397 | A | 12/2000 | Yamazaki et al. |
| 6,198,133 | B1 | 3/2001 | Yamazaki et al. |
| 6,278,131 | B1 | 8/2001 | Yamazaki et al. |
| 6,316,787 | B1 | 11/2001 | Ohtani |
| 6,320,224 | B1 | 11/2001 | Zhang |
| 6,330,044 | B1 | 12/2001 | Murade |
| 6,490,014 | B1 | 12/2002 | Ohtani et al. |
| 6,639,244 | B1 | 10/2003 | Yamazaki et al. |
| 6,639,265 | B2 | 10/2003 | Arao et al. |
| 2001/0019384 | A1 | 9/2001 | Murade |
| 2001/0029070 | A1 | 10/2001 | Yamazaki et al. |
| 2001/0030722 | A1 | 10/2001 | Murade |
| 2002/0024048 | A1 | 2/2002 | Ohtani |
| 2002/0055206 | A1 | 5/2002 | Zhang |
| 2003/0168688 | A1 | 9/2003 | Ohtani et al. |
| 2004/0046174 | A1 | 3/2004 | Ohtani |

FOREIGN PATENT DOCUMENTS

| | | |
|---|---|---|
| JP | 9-312260 | 12/1997 |
| JP | 10031235 | 2/1998 |
| JP | 10-056184 | 2/1998 |
| JP | 10-247735 | 9/1998 |
| JP | 10274789 | 10/1998 |
| JP | 10-294280 | 11/1998 |
| JP | 11-191628 | 7/1999 |
| JP | 2000-183356 | 6/2000 |
| JP | 2000-194014 | 7/2000 |
| JP | 2000-196093 | 7/2000 |

OTHER PUBLICATIONS

U.S. Appl. No. 09/479,842 (pending) filed Jan. 10, 2000, including specification, claims, abstract and drawings.

Shimokawa, R. et al, "Characterization of High–Efficiency Cast–Si Solar Cell Wafers by MBIC Measurement," Japanese Journal of Applied Physics, vol. 27, No. 5, pp. 751–758, May, 1988.

Inui, S. et al, "Thresholdless Antiferroelectricity in Liquid Crystals and its Application to Displays," J. Mater Chem., vol. 6, No. 4, pp. 671–673, 1996.

Yoshida, T. et al, "A Full–Color Thresholdless Antiferroelectric LCD Exhibiting Wide Viewing Angle with Fast Response Time," SID 97 Digest, pp. 841–844, 1997.

Furue, H. et al, "Characteristics and Driving Scheme of Polymer–Stabilized Monostable FLCD Exhibiting Fast Response Time and High Contrast Ratio with Gray–Scale Capability," SID 98 Digest, pp. 782–785, 1998.

Terada, et al, "Half–V Switching Mode FLCD," Proceedings of the 46th Applied Physics Association Lectures, 28p–V–8, p. 1316, Mar., 1999.

Yoshihara, T. et al, "Time Division Full Color LCD by Ferroelectric Liquid Crystal," EKISHO, vol. 3, No. 3, pp. 190–194, 1999.

U.S. Appl. No. 09/477,865 filed Jan. 5, 2000, (pending) including specification, claims, drawings, abstract and PTO filing receipt.

Preliminary Amendment A from Jul. 5, 2001 re: U.S. Appl. No. 09/874,670 (now US patent publication No. US 2001/0029070).

Ohtani et al, "LP–B: Late–News Poster: A 60–in. HDTV Rear–Projector with Continuous–Grain–Silicon Technology," SID 98 Digest, pp. 467–470 (1998).

U.S. Appl. No. 08/862,895 (pending) filed May 23, 1997, including specification, claims, abstract and drawings.

U.S. Appl. No. 09/477,865 (pending) filed Jan. 5, 2000, including specification, claims, abstract, drawings and PTO filing receipt.

U.S. Appl. No. 09/479,852 (pending) filed Jan. 10, 2000, including specification, claims, abstract and drawings.

* cited by examiner

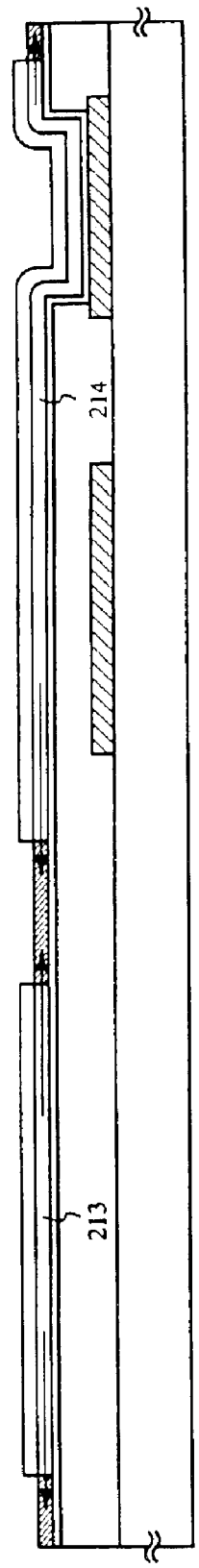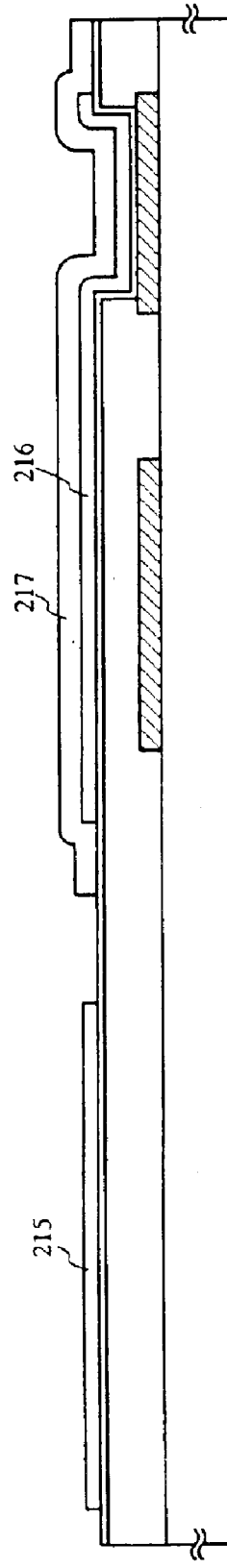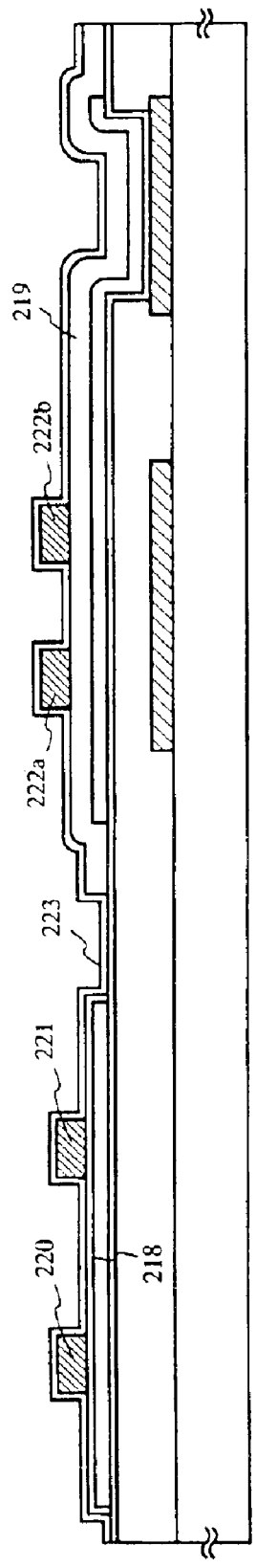
FIG. 3A
FIG. 3B
FIG. 3C

DRIVING CIRCUIT PORTION        PIXEL PORTION

FIG. 6B    CMOS CIRCUIT INDICATED BY ▨

CMOS CIRCUIT INDICATED BY ▨

PIXEL PORTION INDICATED BY ▨

DRIVING CIRCUIT PORTION          PIXEL PORTION

SEMICONDUCTOR DEVICE AND PROCESS FOR PRODUCTION THEREOF

This application is a divisional of U.S. application Ser. No. 09/487,432, filed Jan. 19, 2000 now U.S. Pat. No. 6,590,229.

BACKGROUND OF THE INVENTION

1. Field of the Invention

The present invention relates to a semiconductor device with circuits constructed of thin-film transistors (referred to as TFT hereinafter). More particularly, the present invention relates to electro-optical equipment typified by liquid crystal display devices and EL (electroluminescence) display devices, and to semiconductor circuits. The present invention relates also to electrical equipment (or electronic equipment) with the electro-optical equipment or semiconductor circuits according to the present invention.

The term "semiconductor device" as used in this specification embraces any and all devices which function by utilizing the characteristics of semiconductors. They include electro-optical equipment, semiconductor circuits, and electrical equipment.

2. Description of the Related Art

By virtue of its ability to be formed a transparent substrate, the thin film transistor (referred to as TFT hereinafter) has been actively investigated for its application to the liquid-crystal display of active matrix type (referred to as AM-LCD hereinafter). On account of its high mobility, the TFT made with crystalline semiconductor film (typically polysilicon film) is expected to display fine images if functional circuits are integrated on the same substrate.

AM-LCD is basically constructed of a pixel portion (or pixel matrix circuit) to display images, a gate driving circuit (or gate driver circuit) to drive TFT for each pixel arranged in the pixel portion, a source driving circuit (or source driver circuit) to send image signals to TFT for each pixel, and a data driving circuit (or data driver circuit), all of which are formed on the same substrate. Incidentally, the region in which the gate driving circuit and source driving circuit are formed is called the driving circuit portion.

Recently, the system-on-panel has been proposed which has, in addition to the pixel portion and driving circuit portion, signal processing circuits, such as signal driving circuits and γ-correction circuits, formed on the same substrate.

However, it is difficult to meet all the circuit requirements with TFT of the same structure because the pixel portion and the driving circuit portion differ from each other in their performance required. In other words, the driving circuit portion containing shift register circuits attaches importance to high operation, while the TFT constituting the pixel portion (referred to as pixel TFT) attaches importance to the high withstanding voltage. So far, there has been no TFT structure to satisfy both of them.

The present applicant filed an application for construction which is characterized in that the TFT constituting the driving circuit portion (referred to as driving TFT hereinafter) and the pixel TFT differ from each other in the thickness of the gate insulating film. (Japanese Patent Laid-open No. 10-056184 and its corresponding to U.S. patent application Ser. No. 08/862,895) To be concrete, the gate insulting film of the driving TFT is made thinner than the gate insulating film of the pixel TFT.

SUMMARY

The present invention is an improvement on the pixel portion which is based on the construction disclosed in the above-mentioned official gazette. To be concrete, it is an object of the present invention to provide a construction to secure a large capacity in a small area.

It is another object of the present invention to provide an electro-optical equipment with high reliability (typified by AM-LCD) in which each circuit is constructed of TFT of adequate structure suitable for individual circuits. It is another object of the present invention to provide a semiconductor device (electrical equipment) with high reliability which has the electro-optical device as the display part.

The first aspect of the present invention resides in a semiconductor device of the type in which the pixel portion has a pixel TFT and a storage capacitance for each pixel, characterized in that said pixel TFT has an active layer which is formed above a light blocking film, with an insulating film of two or more laminated layers interposed between them, said storage capacitance is composed of an electrode (which is formed in the same layer as said light blocking film), a dielectric material, and a semiconductor film (of the same composition as the drain region of said pixel TFT), and said dielectric material is a partial layer of said insulating film of two or more laminated layers.

The second aspect of the present invention resides in a semiconductor device of the type in which the pixel portion has a pixel TFT and storage capacitance for each pixel, characterized in that said pixel TFT has an active layer which is formed above a light blocking film, with an insulating film of two or more laminated layers interposed between them, said storage capacitance is composed of an electrode (which is formed in the same layer as said light blocking film), a dielectric material, and a semiconductor film (of the same composition as the drain region of said pixel TFT), and said dielectric material is said insulating film of two or more laminated layers remaining after removal of a portion thereof.

The third aspect of the present invention resides in a semiconductor device of the type in which the pixel portion has a pixel TFT and a storage capacitance for each pixel, characterized in that said pixel TFT has an active layer which is formed above a light blocking film, with a first insulating film (in contact with the light blocking film) and a second insulating film (in contact with said active layer) interposed between them, and said storage capacitance is composed of an electrode (which is formed in the same layer as said light blocking film), said second insulating film, and a semiconductor film (of the same composition as the drain region of said pixel TFT).

The semiconductor device defined above in the third aspect is characterized in that said second insulating film has a thickness which is preferably smaller than 1.5 (preferably $\frac{1}{100}$ to $\frac{1}{10}$) of that of the laminate film composed of said first insulating film and second insulating film.

The fourth aspect of the present invention resides in a process for producing a semiconductor device in which the pixel portion has a pixel TFT and a storage capacitance for each pixel, said process comprising a step of forming on a substrate a light blocking film and an electrode from the same material as the light blocking film, a step of forming a first insulating film that covers said light blocking film and said electrode, a step of etching said first insulating film, thereby forming an opening on said electrode, a step of covering said first insulating film and said opening, thereby forming a second insulating film, and a step of forming a semiconductor film on said second insulating film.

The fifth aspect of the present invention resides in a process for producing a semiconductor device in which there is a driving circuit portion and the pixel portion has a pixel TFT and a storage capacitance for each pixel, said process comprising a step of forming on a substrate a light blocking film and an electrode from the same material as the light blocking film, a step of forming a first insulating film that covers said light blocking film and said electrode, a step of etching said first insulating film, thereby forming an opening on said electrode, a step of covering said first insulating film and said opening, thereby forming a second insulating film, a step of forming a semiconductor film on said second insulating film, a step of covering said semiconductor film, thereby forming a gate insulating film, a step of etching a part of said gate insulating film, thereby exposing the semiconductor film of said driving circuit portion and a part of the semiconductor film of said pixel portion, and a step of performing thermal oxidation, thereby forming a thermally oxidized film on the surface of the semiconductor film which has been exposed by the etching of said gate insulating film.

The sixth aspect of the present invention resides in a process for producing a semiconductor device in which there is a driving circuit portion and the pixel portion has a pixel TFT and a storage capacitance for each pixel, said process comprising a step of forming on a substrate a light blocking film and an electrode from the same material as the light blocking film, a step of forming a first insulating film that covers said light blocking film and said electrode, a step of etching said first insulating film, thereby forming an opening on said electrode, a step of covering said first insulating film and said opening, thereby forming a second insulating film, a step of forming a semiconductor film on said second insulating film, a step of covering said semiconductor film, thereby forming a gate insulating film, a step of etching a part of said gate insulating film, thereby exposing the semiconductor film of said driving circuit portion and a part of the semiconductor film of said pixel portion, a step of performing thermal oxidation, thereby forming a thermally oxidized film on the surface of the semiconductor film which has been exposed by the etching of said gate insulating film, and a step of forming the LDD region in the semiconductor film of said driving circuit portion and the semiconductor film of said pixel portion, such that the LDD region in said driving circuit portion differs in length from that in said pixel portion.

BRIEF DESCRIPTION OF THE DRAWINGS

FIGS. 3A–3C are diagrams showing the process of producing AM-LCD of Embodiment 1.

FIGS. 6A–6D are block diagrams of AM-LCD and a diagram of circuit arrangement of Embodiment 2.

DESCRIPTION OF THE PREFERRED EMBODIMENTS

One embodiment of the present invention will be described with reference to FIG. 1, which is a sectional view of AM-LCD in which the driving circuit portion and the pixel portion are integrally formed on the same substrate. In this embodiment, the basic circuit constituting the driving circuit portion is a CMOS circuit, and the pixel TFT is a TFT of double gate structure. The TFT may also be of single-gate structure or multigate structure, such as triple gate structure.

Figure 1:
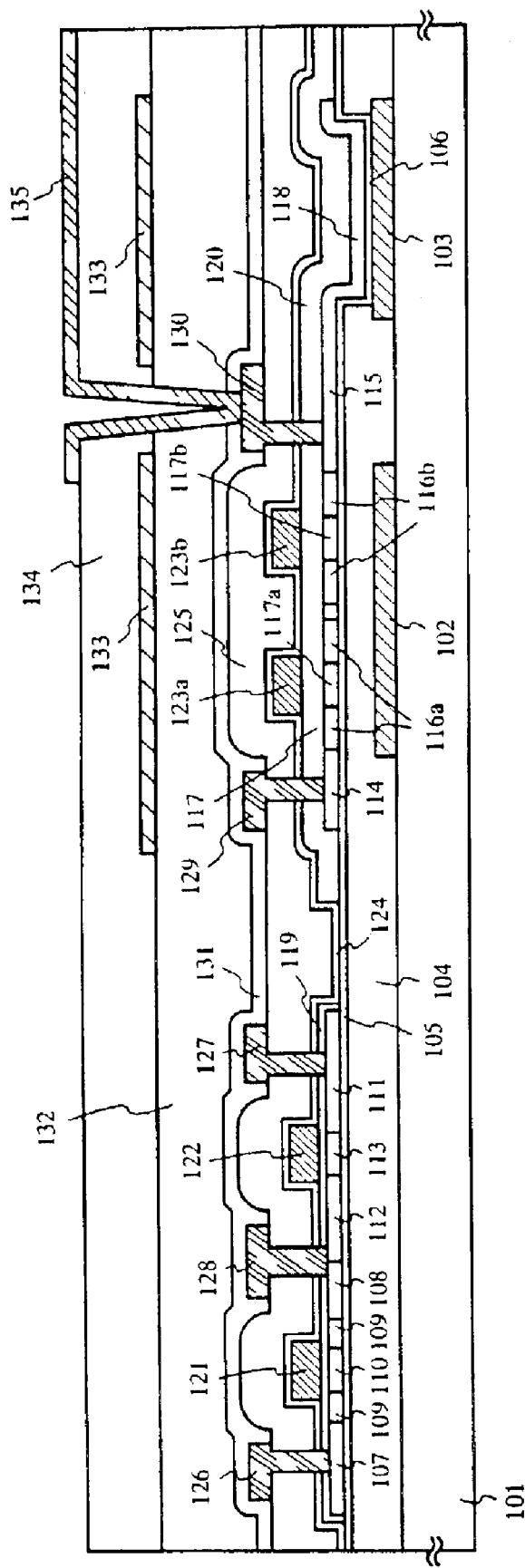
FIG. 1 is a diagram showing the sectional structure of AM-LCD of the present invention.

In FIG. 1, there is shown a heat resistant substrate 101, which may be a quartz substrate, a silicon substrate, a ceramics substrate, or a metal substrate (typically a stainless steel substrate). The substrate, whatever it might be, may have an optional underlying film (preferably an insulating film composed mainly of silicon).

There are shown a light blocking film 102 and a lower electrode 103 for a storage capacitance, which are formed from the same material on the same layer. The light blocking film 102 and the lower electrode 103 are heat-resistant electrically conductive film which withstands temperature of 800–1150° C. (preferably 900–1100° C.).

It typically includes a conductive silicon film (such as phosphorus-doped silicon film and boron-doped silicon film), a metal film (such as tungsten film, tantalum film, molybdenum film, and titanium film), and a film of alloy composed of components of said metal film. They may be in the form of a silicide film or a nitride film (such as tantalum nitride film, tungsten nitride film, and titanium nitride film). They may be used in combination to form a laminate.

The above-mentioned metal film should preferably be used in the form of laminate with a silicon film to protect its oxidation. It may also be covered with an insulating film composed mainly of silicon so as to effectively protect its oxidation. Incidentally, the term "an insulating film composed mainly of silicon" as used in this specification denotes a silicon oxide film, a silicon nitride film, or any insulating film containing silicon, oxygen, and nitrogen in a prescribed ratio.

There is also shown an underlying film 104 which is 0.3–1 μm thick, preferably 0.6–0.8 μm thick. It is referred to as a first insulating film hereinafter. It is an insulating film composed mainly of silicon. On this first insulating film 104 is formed an opening which becomes later a storage capacitance. On that is formed again an insulating film 105 composed mainly of silicon. It is referred to as a second insulating film hereinafter.

What is shown here is of double-layer structure, one layer being the first insulating film 104 in contact with the light blocking film and the other layer being the second insulating film 105 in contact with the active layer of the pixel TFT. It may also be of multilayer structure. Therefore, the eventual structure will be such that the active layer of the pixel TFT is formed above the light blocking film 102, with the insulating film (in the form of laminate with at least two layers) interposed between them. A partial layer (one layer or more layers) of the laminated insulating film constitutes the dielectric for the storage capacitance. In other words, those layers which remain after a partial layer is removed from the laminated insulating film become the dielectric for the storage capacitance.

In this embodiment, the second insulating film 105 functions as the dielectric for the storage capacitance (indicated by 106). The second insulating film 105 (or the dielectric 106 for the storage capacitance) should be 5–75 nm thick, preferably 20–50 nm thick. The thinner the second insulating film, the greater the storage capacitance it has. However, withstanding voltage should be taken into account to prevent leak current. An effective way to increase the withstanding voltage is to form the film as two-layer laminate.

The first insulting film 104 should have a sufficient thickness so that the light blocking film 102 does not form parasitic capacity in concert with the TFT above. Forming an opening at the part for the storage capacitance makes it possible to make thin the dielectric for the storage capacitance. Thus it is possible to gain capacity without increasing the area on which capacity is formed. This construction for the storage capacitance is not disclosed in the above-mentioned Japanese Patent Laid-open No. 10-056184.

Incidentally, what is characteristic of the structure shown in FIG. 1 is that there is a difference in film thickness between the insulating film formed between the active layer of the pixel TFT and the light blocking film 102 (or the laminate film composed of the first insulating film 104 and the second insulating film 105) and the second insulating film 105 formed between the upper electrode 118 for the storage capacitance made of semiconductor film and the lower electrode 103 for the storage capacitance (the dielectric 106 for the storage capacitance). To be concrete, the thickness of the latter should be 1/5 (preferably 1/100–1/10) of the thickness of the former.

In this way it is possible to form a large storage capacitance without causing parasitic capacity to occur between the pixel TFT and the light blocking film 102.

Incidentally, the light blocking film 102 formed under the pixel TFT may be left in the floating state or kept at a fixed potential. The fixed potential should be lower than the minimum potential of video signals, preferably equal to or lower than the minimum source potential of the entire circuits formed on the substrate.

For example, in the case of AM-LCD, various power supply lines are formed in the driving circuit portion, other signal processing circuits, and pixel portion, and they are provided with their prescribed potential. In other words, there is a minimum potential as reference, and various voltages are established according to this reference. The minimum source potential denotes the minimum potential that functions as reference in all circuits.

By making the light blocking film 102 in the floating state or keeping it at a fixed potential as mentioned above, it is possible to form the light blocking which does not affect TFT operation (or does not cause parasitic capacity).

The light blocking film formed under the pixel TFT as mentioned above prevents the occurrence of light leak current due to stray light through the substrate. It is not necessary to form the light blocking film on the driving circuit side which is not exposed to light. This is preferable from the standpoint of making the parasitic capacity as small as possible.

On the first insulating film 104 and the second insulating film 105 are formed the active layer of the driving TFT, the active layer of the pixel TFT, and the semiconductor film which becomes the upper electrode for the storage capacitance. Incidentally, the term "electrode" as used in this specification is a part of "wiring" and denotes the part for electrical connection with other wirings or the part for intersection with semiconductor film. Consequently, "wiring" always includes "electrode" although they are used separately for convenience of explanation.

In FIG. 1, the active layer of the driving TFT is composed of the source region 107, drain region 108, LDD (lightly doped drain) region 109, and the channel-forming region 110 of the N-channel type TFT (referred to as NTFT hereinafter), and the source region 111, drain region 112, and the channel-forming region 113 of the P-channel type TFT (referred to as PTFT hereinafter).

The active layer of the pixel TFT (which is NTFT in this explanation) is formed in the source region 114, the drain region 115, the LDD regions 116a and 116b, and the channel-forming regions 117a and 117b. Moreover, the semiconductor film extending from the drain region 115 is used as the upper electrode 118 for the retention capacitor. In other words, the upper electrode 118 for the storage capacitance is composed of semiconductor film of the same composition as the drain region 115.

As mentioned above, according to the present invention, the storage capacitance is formed by the electrode (or the lower electrode 103 for the storage capacitance) formed on the same layer as the light blocking film 102, the dielectric (or the second insulating film 105), and the semiconductor film (or the drain region 115 of the pixel TFT) of the same composition as the drain region of the pixel TFT.

However, it is not always necessary that the drain region is connected directly to the upper electrode for the storage capacitance; they may be electrically connected to each other through other wirings. In addition, it is not always necessary that they are of the same composition; they may be semiconductor film of other conductivity type or semiconductor film containing the same impurity as the drain region in different concentrations.

In the case shown in FIG. 1, there is a difference in the width (or length) of the LDD region between the driving TFT and the pixel TFT. It is necessary that the driving TFT (for which operating speed is important) should be thin to minimize resistance, and the pixel TFT (for which low off current (or drain current that flows when TFT is off state) is important) needs the LDD region with a certain length. Therefore, the LDD region of the driving TFT should preferably be equal to or narrower than the LDD region of the pixel TFT.

Then, the gate insulating film is formed such that it covers the active layer and the upper electrode for the storage capacitance. According to the present invention, it is formed such that the thickness of the gate insulating film 119 of the driving TFT is smaller than the thickness of the gate insulating film 120 of the pixel TFT. Typically, the thickness of the gate insulating film 120 is 50–200 nm (preferably 100–150 nm) and the thickness of the gate insulating film 119 is 5–50 nm (preferably 10–30 nm).

Incidentally, the gate insulating film of the driving TFT is not necessarily of single thickness. In other words, the driving TFT may have insulating films with different thicknesses in the driving circuit portion. In such a case, it follows that there are three or more kinds of TFT having gate insulating films differing in thickness on the same substrate. In other words, it can be said that the gate insulating film of at least part of the driving TFTs contained in the driving circuit portion is thinner than the gate insulating film of the pixel TFT.

Then, on the gate insulating films 119 and 120 are formed the gate wirings 121 and 122 of the driving TFT and the gate wirings 123a and 123b of the pixel TFT. The gate wiring 121, 122, 123a, and 123b is formed from heat-resistant electrically conductive film which withstands temperatures of 800–1150° C. (preferably 900–1100° C.). To be concrete, the material is selected from the same one as the above-mentioned light blocking film 102 or the lower electrode 103 for the storage capacitance.

In other words, it includes a conductive silicon film (such as phosphorus-doped silicon film and boron-doped silicon film), a metal film (such as a tungsten film, a tantalum film, a molybdenum film, and a titanium film), and a film of alloy composed of components of said metal film. They may be in the form of a silicide film or a nitride film (such as a tantalum nitride film, a tungsten nitride film, and a titanium nitride film). They may be used in combination to form a laminate.

Also, the above-mentioned metal film should preferably be used in the form of laminate with a silicon film to protect its oxidation. The metal film may also be covered with an insulating film composed mainly of silicon so as to effectively protect its oxidation. In FIG. 1, the protective film 124 is formed to protect the gate wiring from oxidation.

Then, the first interlayer insulating film 125 is formed. It is an insulating film (single layer or laminate) composed mainly of silicon. The insulating film composed mainly of silicon may be silicon oxide film, silicon nitride film, silicon oxide nitride film (containing nitrogen more than oxygen), or silicon nitride oxide film (containing oxygen more than nitrogen).

Then, a contact hole is formed in the first interlayer insulating film 125, and the source wirings 126 and 127 and the drain wiring 128 of the driving TFT and the source wiring 129 and drain wiring 130 of the pixel TFT are formed. On it are formed the passivation film 131 and the second interlayer insulating film 132. On it is further formed the light blocking film (black mask) 133. Moreover, on the light blocking film 133 is formed the third interlayer insulating film 134. A contact hole is formed, and then the pixel electrode 135 is formed.

The second interlayer insulating film 132 and the third interlayer insulating film 134 should preferably be a resin film having a small relative permittivity. Embodiments of the resin film include a polyimide film, an acrylic film, a polyamide film, and a BCB (benzocyclobutene film).

And, the pixel electrode 135 may be a transparent conductive film typified by ITO film, if AM-LCD of transmission type is to be obtained, or it may be a highly reflective metal film typified by aluminum film, if AM-LCD of reflection type is to be obtained.

Incidentally, in FIG. 1, the pixel electrode 135 is electrically connected to the drain region 115 of the pixel TFT through the drain electrode 130. Alternatively, the pixel electrode 135 may be connected directly to the drain region 115.

The AM-LCD constructed as mentioned above is characterized in that the gate insulating film of the driving TFT is thinner than the gate insulating film of the pixel TFT and the first insulating is selectively removed at the part for the storage capacitance and the thin second insulating film functions as the dielectric for the storage capacitance. In this case, there is the first insulating film (which is sufficiently thick) between the light blocking film 102 formed under the pixel TFT and the active layer. Therefore, there is no problem with parasitic capacity.

In this way it is possible to arrange TFT most suitable for the performance of the circuit, and at the same time it is also possible to realize the storage capacitance to secure a large capacity in a small area.

The present invention constructed as mentioned above will be described in more detail with reference to the following embodiments.

Embodiment 1

Embodiment 1 demonstrate the process for producing the structure of FIG. 1, which was explained above in "Description of the Preferred Embodiments". Explanation will be made with reference to FIGS. 2A to 5B.

First, a quartz substrate 201 (as the substrate) is made ready. On the substrate are formed the light blocking film 202 and the lower electrode 203 for the storage capacitance. Each of the light blocking film 202 and the storage capacitance is a laminate composed of a silicon film, a tungsten nitride film, a tungsten film (arranged upward), or a laminate composed of a silicon film, tungsten silicide film, and silicon film (arranged upward). Needless to say, it is also possible to use other conductive films explained in "Description of the Preferred Embodiments". In this embodiment, the film thickness is 200 nm.

Then, the first insulating film 204 (0.6 $\mu$m thick) of silicon oxide is formed such that it covers the light blocking film 202 and the lower electrode 203 for the storage capacitance. A part for the storage capacitance (above the lower electrode 203 for the storage capacitance) is selectively etched to form the opening 205. Then, the second insulating film 206 (20 nm thick) of silicon oxide and the amorphous silicon film 207 are formed by low pressure thermal CVD such that they cover the first insulating film 204 and the opening 205. This step is carried out continuously without exposing to air. In this way it is possible to prevent impurities (such as boron contained in the air) from being adsorbed to the lower surface of the amorphous silicon film.

Incidentally, Embodiment 1 employs the amorphous silicon film; however, it may be replaced any other semiconductor film, such as microcrystalline silicon film and amorphous silicon germanium film.

The second insulating film 206 functions as the dielectric for the storage capacitance. Therefore, in this embodiment, it is formed from silane ($SiH_4$) and nitrous oxide ($N_2O$) at 800° C. Thus there is obtained a silicon oxide film (dielectric) of high quality.

Then, the amorphous silicon film 207 is crystallized. Crystallization may be accomplished by any know technology. The one disclosed in Japanese Patent Laid-open No. 9-312260 is used in this embodiment. This technology employs an element selected from nickel, cobalt, palladium, germanium, platinum, iron, and copper as the catalyst to promote crystallization. Crystallization of the amorphous silicon film is accomplished by growth in solid phase.

Figure 2A:
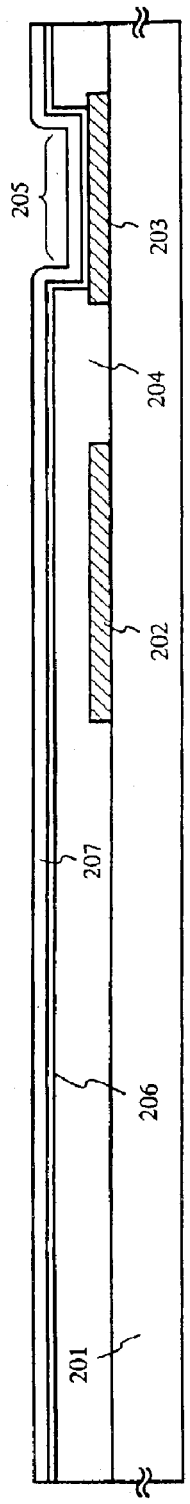
FIGS. 2A–2C are diagrams showing the process of producing AM-LCD of Embodiment 1.
Figure 2B:
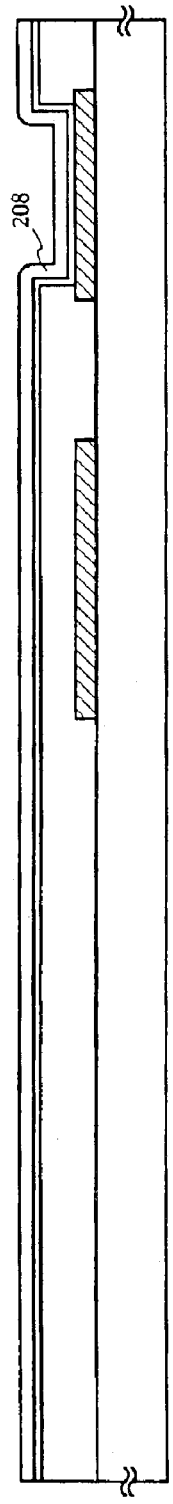
Figure 2C:
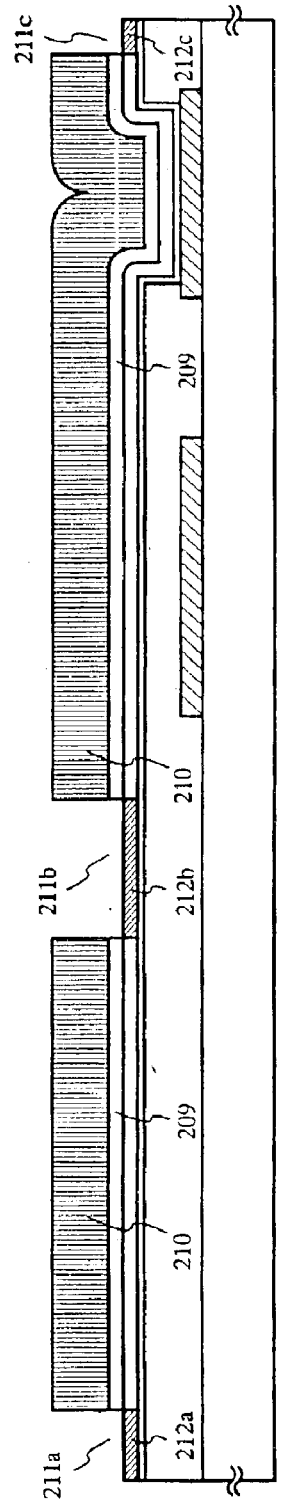

In this embodiment, nickel is selected as the catalyst element, so that a nickel-containing layer (not shown) is formed on the amorphous silicon film 207. And, heat treatment is carried out at 550° C. for 4 hours for crystallization. Thus there is formed the crystalline silicon (polysilicon) film 208. The state up to this stage is shown in FIG. 2B.

Incidentally, the crystalline silicon film 208 may be incorporated with an impurity (phosphorus or boron) to control the threshold voltage of TFT. Phosphorus and boron may be added individually, or either of them may be added.

Then, the mask film 209 (100 nm thick) of silicon oxide is formed on the crystalline silicon film 208, and on it is formed the resist mask 210. Using the resist mask 210 as a mask, the mask film 209 is etched so as to form the openings 211a–211c.

In this state, an element (phosphorus in this embodiment) belonging to Group 15 of the periodic table is added so as to form the phosphorus-doped regions 212a–212c. Incidentally, the concentration of phosphorus added should be $5\times10^{18}$ to $1\times10^{20}$ atoms/cm$^3$ (preferably $1\times10^{19}$ to $5\times10^{19}$ atoms/cm$^3$). However, the concentration of phosphorus added is not limited to this range. It varies depending on the temperature and time of the subsequent gettering step and on the area of the phosphorus doping region. See FIG. 2C.

Then, the resist mask 210 is removed, and heat treatment is carried out at 450–650° C. (preferably 500–600° C.) for 2–16 hours for the gettering of nickel remaining in the crystalline silicon film. The temperature for effective gettering is 50° C. higher or lower than the maximum temperature in heat history. Heat treatment at 500–650° C. is good for satisfactory gettering because heat treatment for crystallization is carried out at 550–600° C.

In this embodiment, heat treatment at 600° C. for 8 hours moves nickel in the direction of arrow, so that nickel is gettered (captured) by the phosphorus regions 211a–212c. In this way the concentration of nickel remaining in the crystalline silicon films 213 and 214 is reduced below $2\times10^{17}$ atms/cm$^3$ (preferably $1\times10^{16}$ atoms/cm$^3$). This concentration is confirmed by secondary ion mass spectroscopy (SIMS). The above values are measurable limits. See FIG. 3A.

The step for the gettering of nickel is followed by the patterning of the crystalline silicon films 213 and 214 so as to form the active layer (semiconductor film) 215 of the driving TFT and the active layer 216 of the pixel TFT. In this step, it is desirable to completely remove the phosphorus-doped region which has captured nickel.

Then, the gate insulating film 217 is formed by plasma CVD or sputtering. This gate insulating film functions as the gate insulating film of the pixel TFT. It is 50–200 nm thick. In this embodiment, it is a silicon oxide film, 100 nm thick. The silicon oxide film may be laminated with a silicon nitride film or incorporated with nitrogen to yield silicon oxide nitride film.

After the gate insulating film 217 has been formed, a resist mask (not shown) is formed. The gate insulating film is etched, so that the active layer of the driving circuit portion and a part of the active layer of the pixel portion are exposed. In other words, the gate insulating film 217 on the pixel TFT is left and that on the region to become the driving TFT is removed. The state up to this step is shown in FIG. 3B.

Then, heat treatment is carried out at 800–1150° C. (preferably 900–1100° C.) for 15 minutes to 8 hours (preferably 30 minutes to 2 hours) in an oxidizing atmosphere (thermal oxidation). In this embodiment, thermal oxidation is carried out in an oxygen atmosphere at 950° C. for 30 minutes.

Incidentally, the oxidizing atmosphere may be either a dry oxygen atmosphere or a wet oxygen atmosphere. The former is suitable for reduction of crystal defects in the semiconductor film. The oxygen atmosphere may contain a halogen. Thermal oxidation treatment in a halogen-containing atmosphere is expected to produce the effect of removing nickel.

The thermal oxidation treatment forms the silicon oxide film (thermally oxidized film) 218, 5–50 nm thick (preferably 10–30 nm thick) on the surface of the semiconductor film which has been exposed by the etching of the gate insulating film mentioned above. The silicon oxide film 218 eventually functions as the gate insulating film of the driving TFT.

Oxidation reaction proceeds in the interface between the gate insulating film 217 (which is a silicon oxide film remaining in the pixel TFT) and the semiconductor film 216 under it. Therefore, the gate insulating film 219 of the pixel TFT eventually has a thickness of 50–200 nm (preferably 100–150 nm).

After the thermal oxidation step has been completed, the gate wirings 220 (adjacent to NTFT) and 221 (adjacent to PTFT) of the driving TFT and the gate wirings 222a and 222b of the pixel TFT are formed. Incidentally, the gate wirings 222a and 222b are depicted as if there are two lines because the pixel TFT is of double-gate structure; however, in fact it is the same wiring.

In this embodiment, each of the gate wirings 220–222b is a laminate film composed of a silicon film, a tungsten nitride film, a tungsten film (arranged upward), or a laminate film composed of a silicon film and a tungsten silicide film (arranged upward). Needless to say, it is also possible to use other conductive films explained in "Description of the Preferred Embodiments". In this embodiment, the thickness of the gate wiring is 250 nm.

Incidentally, in this embodiment, the lowermost layer of the silicon film is formed by low pressure thermal CVD. Since the gate insulating film of the driving circuit is as thin as 5–50 nm, sputtering or plasma CVD may cause damage to the semiconductor film (active layer) under certain conditions. Therefore, thermal CVD is preferable which forms film by chemical gas-phase reaction.

Then, then each of the gate wirings 220–222b is covered with the SiN$_x$O$_y$ film 223, 25–50 nm thick, (x=0.5–2, y=0.1–0.8). This SiN$_x$O$_y$ film 223 protects the gate wirings 220–222b from oxidation and also functions as an etch stopper when the side wall (silicon film) is removed afterward. Incidentally, this step may be repeated twice so as to effectively reduce pinholes.

The step of forming the SiN$_x$O$_y$ film 213 may be preceded by plasma treatment with a hydrogen-containing gas (ammonia in this embodiment). This pretreatment confines hydrogen (which has been activated or excited by plasma) in the active layer (semiconductor film), so that hydrogen termination is accomplished effectively.

Moreover, if nitrous oxide gas is added in addition to the hydrogen-containing gas is added, the surface of the object for treatment is cleaned by water evolved. Therefore, it is possible to effectively prevent contamination with boron etc. contained in the atmosphere. The state up to this step is shown in FIG. 3C.

Then, an amorphous silicon film (not shown) is formed. Anisotropic etching is carried out with a chlorine-based gas, so as to form the side walls 224, 225, 226a, and 226b. After that, the resist masks 227a and 227b are formed. Then, the semiconductor films 215 and 216 are doped with an element (phosphorus in this embodiment) belonging to Group 15 of the periodic table.

At this time, the gate wirings 220–222b, the side walls 224–226, and the resist masks 227a and 227b function as masks, and the impurity regions 228–232 are formed. The concentration of phosphorus added to the impurity regions 228–232 is $5\times10^{19}$–$1\times10^{21}$ atoms/cm$^3$. In this specification, the concentration of phosphorus is represented by (n+). See FIG. 4A.

This step may be carried out separately or simultaneously for the region which becomes the driving TFT (with a thin gate insulating film) and the storage capacitance and the region which becomes the driving TFT (with a thick gate insulating film). Also, the step of phosphorus doping maybe accomplished by means of ion implantation (which performs mass separation) or plasma doping (which does not perform mass separation). The accelerating voltage and the amount of dose may be adequately established by the person who practices the invention.

Figure 4A:
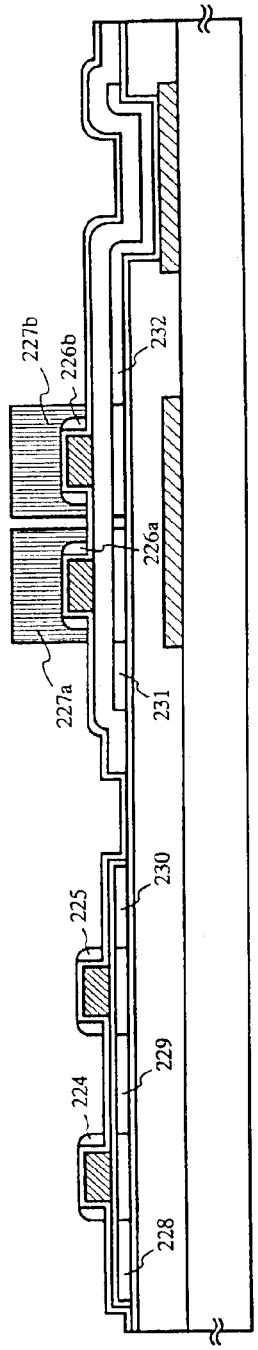
FIGS. 4A–4C are diagrams showing the process of producing AM-LCD of Embodiment 1.
Figure 4B:
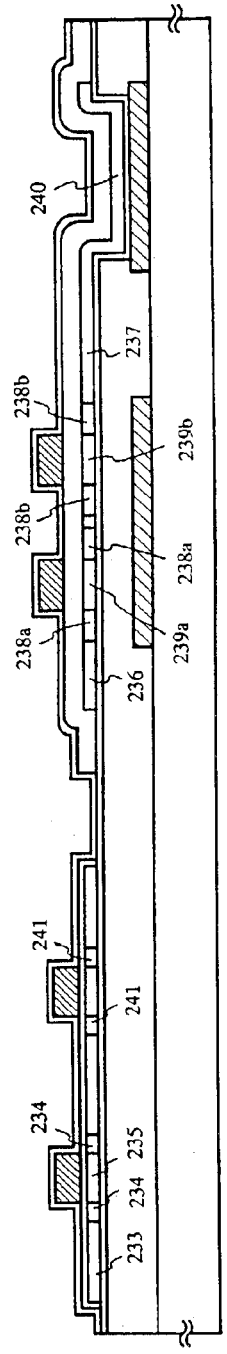
Figure 4C:
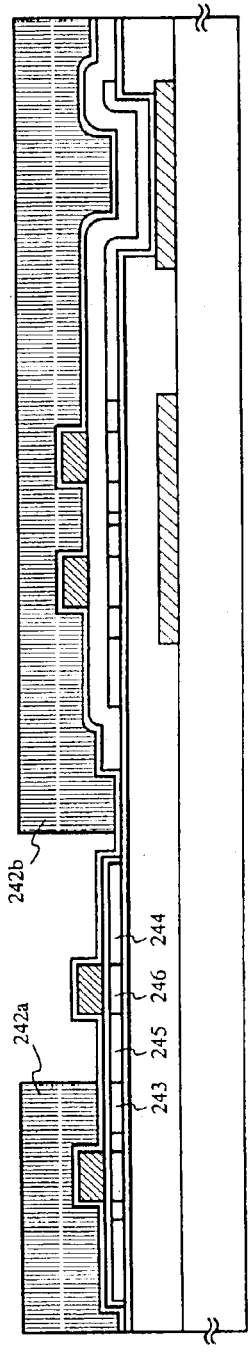

Thus the state shown in FIG. 4A is obtained. Then, the resist masks 227a and 227b and the side walls 224–226b are removed. The step of phosphorus doping is repeated. This step is carried out such that the phosphorus dosage is lower than that in the previous step. In this way a lightly doped region is formed in the region which was not doped with phosphorus in the previous step. This step is carried out such that the concentration of phosphorus doped in the lightly doped region is $5\times10^{17}$–$5\times10^{18}$ atoms/cm$^3$. In this specification, the concentration of phosphorus in this case is represented by (n–). See FIG. 4B.

Needless to say, this step may also be carried out separately or simultaneously for the region which becomes the driving TFT (with a thin gate insulating film) and the storage capacitance and the region which becomes the driving TFT (with a thick gate insulating film). Also, the step of phosphorus doping may be accomplished by means of ion implantation (which performs mass separation) or plasma doping (which does not perform mass separation). The accelerating voltage and the amount of dose may be adequately established by the person who practices the invention.

Since this lightly doped region functions as the LDD region, it is necessary to carefully control the phosphorus concentration. In this embodiment, plasma doping is carried out so that the doped phosphorus has the concentration distribution (or concentration profile) as shown in FIG. 9.

Figure 9:
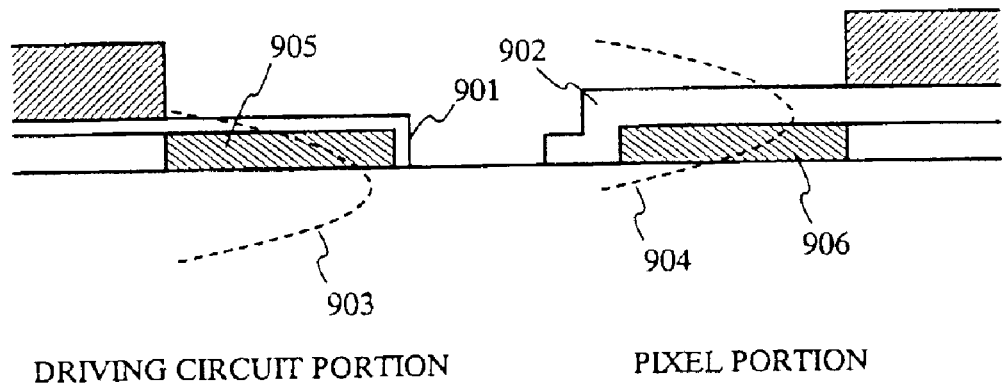
FIG. 9 is a diagram showing the concentration distribution resulting from the doping of impurity elements of Embodiment 1.

In FIG. 9, there is a difference in thickness between the gate insulating film 901 adjacent to the driving circuit portion and the gate insulating film 902 adjacent to the pixel portion. Consequently, the doped phosphorus varies in concentration distribution in the depthwise direction.

In this embodiment, the condition (such as accelerating voltage) for phosphorus doping is controlled so that the doped phosphorus has the concentration distribution 903 in the driving circuit portion and the concentration distribution 904 in the pixel portion. In this case, the concentration distribution in the depthwise direction varies but the phosphorus concentration in the lightly doped regions 905 and 906 is approximately the same.

Incidentally, the step shown in FIG. 9 can be applied to all other steps for impurity doping mentioned in this specification.

This step defines the source region 233, the LDD regions 234, and the channel forming region 235 of the NTFT constituting the CMOS circuit. This step also defines the source region 236, the drain region 237, the LDD regions 238a and 238b, and the channel forming regions 239a and 239b of the pixel TFT.

Further, the lower electrode 240 for the storage capacitance is defined. In this embodiment, the lower electrode 240 for the storage capacitance is doped with phosphorus in the same concentration as the source region or drain region by both the first phosphorus doping (n+) step and the second phosphorus doping (n–) step. Therefore, it becomes a conductive semiconductor region having the same composition as the source region or drain region of NTFT.

In this step, the lightly doped region 241 similar to that in NTFT is formed in the region which becomes PTFT of the CMOS circuit.

Then, the region, except for the region which becomes PTFT of the CMOS circuit, is covered with resist masks 242a and 242b, and doping is performed with an element (boron in this embodiment) belonging to Group 13 of the periodic table. This doping stet is carried out such that the concentration of boron is higher than that of previously doped phosphorus. To be concrete, boron is doped in concentrations of $1\times10^{20}$ to $3\times10^{21}$ atoms/cm$^3$. In this specification, the boron concentration in this step is denoted by (p++). As the result, the impurity region with N-type conductivity formed in the region to become PTFT has its conductivity inverted by boron and takes on P-type conductivity. See FIG. 4C.

Needless to say, this step may be accomplished by means of ion implantation (which performs mass separation) or plasma doping (which does not perform mass separation). The accelerating voltage and the amount of dose may be adequately established by the person who practices the invention.

This step defines the source region 244, the drain region 245, and the channel forming region 246 of the PTFT constituting the CMOS circuit. This step also defines the drain region 243 of the NTFT of the CMOS circuit.

In this way all the impurity regions are formed. Then, the resist masks 242a and 242b are removed. Heat treatment is carried out at 750–1150° C. for 20 minutes to 12 hours. In this embodiment, this heat treatment is carried out in an inert atmosphere at 950° C. for 2 hours. See FIG. 5A.

This step activates phosphorus or boron added to each impurity region. It also expands the LDD region inward (or toward the channel forming region), thereby producing the structure in which the LDD region overlaps with the gate wiring, with the gate insulating film interposed between them.

In other words, in the LDD region 247 of the driving TFT, phosphorus contained in the LDD region 247 diffuses toward the channel forming region 248. This creates a state in which the LDD region 247 overlaps with the gate wiring 220, with the gate insulating film interposed between them. This structure effectively prevents degradation due to hot carrier injection.

Likewise, in the PTFT of the driving TFT, the source region 249 and the drain region 250 diffuse toward the channel forming region 251 and overlap with the gate wiring 221. Also, in the pixel TFT, the LDD region 252a and 252b diffuses toward the channel forming regions 253a and 253b, respectively, and overlaps with the gate wirings 222a and 222b, respectively.

The diffusion distance of impurity can be controlled by heat treatment temperature and time. Therefore, it is possible to control as desired the distance (length) over which the LDD region (or the source region and drain region of PTFT) overlaps with the gate wiring. In this embodiment, adjustment is made so that the overlapping distance is 0.05–1 $\mu$m (preferably 0.1–0.3 $\mu$m).

Also, this step activates phosphorus added to the upper electrode 254 for the storage capacitance, so that it becomes the region which has N-type conductivity. In other words, it is possible to make the semiconductor film function as the upper electrode 254 without applying a voltage to the lower electrode 103 for the storage capacitance, thereby to induce carriers.

Figure 5A:
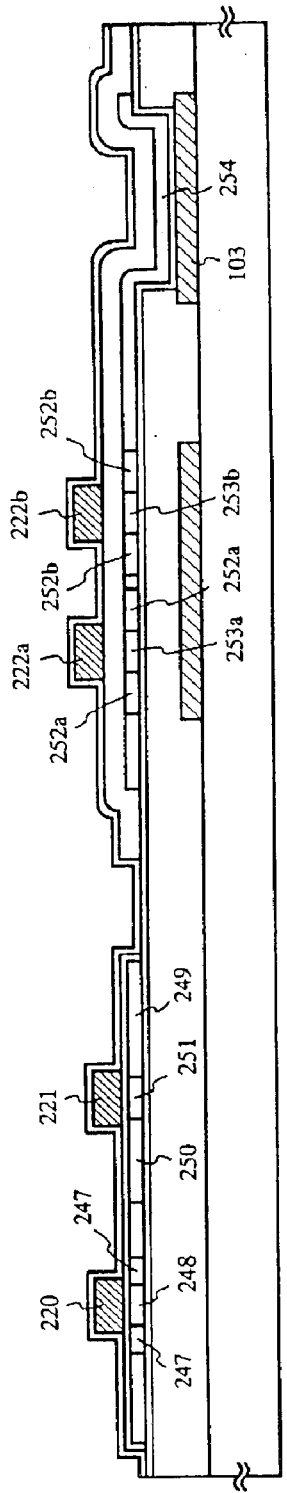
FIGS. 5A–5B are diagrams showing the process of producing AM-LCD of Embodiment 1.

The state up to this step is shown in FIG. 5A. Then, the first interlayer insulating film 255 is formed. In this embodiment, it is a silicon oxide film (1 $\mu$m thick) formed by plasma CVD. A contact hole is formed and then the source wirings 256 to 258 and the drain wirings 259 and 260 are formed. Each of these wirings is a laminate in which a conductive film composed mainly of aluminum is held between two titanium films.

After the source wirings and drain wirings have been formed, hydrogenation is performed. This step consists of exposing the entire substrate to hydrogen activated (or excited) by plasma or heat. The temperature for hydrogenation is 350–450° C. (preferably 380–420° C.) in the case of heat-activated hydrogen.

After that, the passivation film 261 is formed. The passivation film 261 includes a silicon nitride film, a silicon oxide nitride film, a silicon nitride oxide film, and a laminate of one of these insulating films with a silicon oxide film. In this embodiment, the passivation film is a silicon nitride film (300 nm thick).

Incidentally, in this embodiment, the step of forming a silicon nitride film is preceded by plasma treatment with ammonia gas so as to form the passivation film 261. The pretreatment confines the plasma-activated (excited) hydrogen in the passivation film 261. Further, if hydrogen-containing gas is used together with nitrous oxide gas, it evolves water which cleans the surface of the object for treatment. This is effective in preventing contamination with boron etc. contained in the atmosphere.

After the passivation film 261 has been formed in this way, heat treatment at about 400–420° C. is carried out. The atmosphere for heat treatment may be an inert atmosphere or a hydrogen-containing atmosphere. This step releases hydrogen from the passivation film 261 (which is a silicon nitride film) and causes this hydrogen to diffuse downward. This step also causes hydrogen contained in large amounts in the first interlayer insulating film 255 by the previous hydrogenation step to diffuse downward. (Upward diffusion is blocked by the passivation film 261.) Thus the active layer (semiconductor film) is terminated with hydrogen. As the result, it is possible to effectively inactivate dangling bonds in the active layer.

After the hydrogenation treatment, the second interlayer insulating film 262 is formed, which is an acryl film, 1 $\mu$m thick. On it is formed a titanium film (200 nm thick), which is subsequently patterned to form the light blocking film (black mask) 263.

Figure 5B:
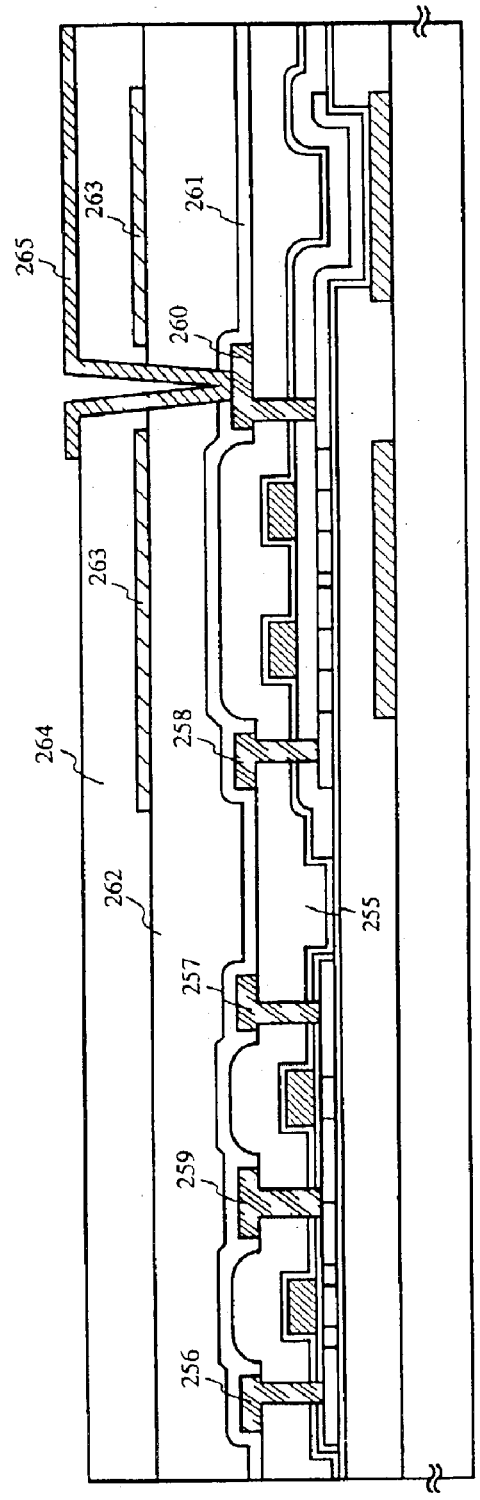

Then, the third interlayer insulating film 264 is formed, which is an acryl film, 1 $\mu$m thick. A contact hole is formed, and the pixel electrode 265 of ITO film is formed. Thus, AM-LCD constructed as shown in FIG. 5B is completed.

The AM-LCD according to the present invention is characterized in that there is a difference in the thickness of the gate insulating film between the driving circuit portion (or signal processing circuit part) and the pixel portion which are formed on the same substrate. Typically, the gate insulating film of the driving TFT used for the driving circuit portion is thinner than that of the pixel TFT used for the pixel portion.

Moreover, the pixel portion is provided with the light blocking film under the pixel TFT, with a thick underlying film (the first insulating film) interposed between them, so as to prevent the formation of parasitic capacity. Further, the underlying film is selectively removed at the part to become the storage capacitance, and a new thin dielectric (the second insulating film) is formed so as to produce a large storage capacitance.

According to the production step of this embodiment, the active layer (semiconductor film) of TFT which is finally formed is a crystalline silicon film of unique crystal structure having continuous crystal lattice. This feature is explained in the following.

The first feature is that the crystalline silicon film formed by the above-mentioned step has the crystalline structure in which microscopic needle crystals or rod-like crystals (collectively referred to as rod-like crystals) gather together. This crystal structure is readily confirmed by observation under a transmission electron microscope (TEM).

The second feature is that the ratio of orientation of the {220} plane is greater than 0.7, typically greater than 0.85, as calculated by X-ray diffractometry (strictly speaking, X-ray diffractometry for θ–2θ method). The ratio of orientation is calculated according to the method disclosed in Japanese Patent Laid-open No. 7-321339.

The third feature is that the crystal lattice is continuous at the grain boundary. The present inventors have confirmed this by observing the grain boundary at which individual rod-like crystals come into contact with one another, by means of an HR-TEM (high-resolution transmission electron microscope). It is readily confirmed from the fact that the lattice stripes observed are continuously joined together in the crystal grain boundary.

The continuity of the crystal lattice at the crystal grain boundary results from the fact that the crystal grain boundary is the one which is referred to as "planar grain boundary". This term used in this specification accords with the definition given in "Characterization of High-Efficiency Cast-Si Solar Cell Wafers by MBIC Measurement; Ryuichi Shimokawa and Yutaka Hayashi, Japanese Journal of Applied Physics vol.27, No.5, pp. 751–758, 1988".

According to the above-mentioned paper, the planar grain boundary includes twin grain boundary, special laminate defect, and special twist grain boundary. The feature of this planar grain boundary is that it is electrically inert. In other words, this planer grain boundary can be regarded as substantially non-existing because it does not function as a trap to impede the movement of carries even though it is the grain boundary.

In the case where the crystal axis (the axis perpendicular to the crystal plane) is the <110> axis, the {211} twin grain boundary is referred to as the coincidence boundary of Σ3. The Σ value is a parameter indicating the degree of matching of the coincidence boundary. For example, it is known that the grain boundary formed between two crystal grains is the coincidence boundary of Σ3 if the orientation of their crystal plane is {110} and the angle (θ) of the lattice stripe corresponding to the {111} plane is 70.5°.

The crystalline silicon film in this embodiment has the following feature. Most of grain boundaries between two crystals with the <110> axis are formed such that the grain stripes of adjacent crystal grains are continuous at an angle of about 70.5°. This is found by observation with an HR-TEM. Therefore, it is presumed that the grain boundary is the coincidence boundary of Σ3, that is, the {211} twin boundary.

The crystal structure (to be more accurate, the structure of crystal grain boundary) mentioned above indicates that two different crystal grains are joined together with extremely good matching. That is, at the grain boundaries the crystal lattices are continuously connected, so that the trap level due to lattice defect scarcely occurs. Therefore, it may be assumed that crystal grains do not substantially exist in the semiconductor film having the above-mentioned crystal structure.

In addition, it has also been confirmed by observation with a TEM that defects in crystal grains are diminished almost completely by heat treatment (or thermal oxidation step in this embodiment) at high temperatures of 700–1150° C. It is apparent that the number of defects is greatly reduced after this heat treatment step.

The difference in the number of defects manifests itself as the difference in spin density determined by ESR (Electron Spin Resonance). It is known that the crystalline silicon film produced in the step of this embodiment has a spin density smaller than $5 \times 10^{17}$ spins/cm$^3$ (preferably smaller than $3 \times 10^{17}$ spins/cm$^3$). Since this measured value is close to the detecting limit of the measuring apparatus, the actual spin density would be much smaller.

It is concluded from the foregoing that the crystalline silicon film obtained in this embodiment may be regarded as a single-crystal silicon film or a substantially single-crystal silicon film because it is substantially free of crystal grain boundaries.

(Regarding Electrical Properties of TFT)

The TFT produced in this embodiment exhibits good electrical properties comparable to those of MOSFET. The present inventors' experimental TFT (with a 35 nm thick active layer and an 80 nm thick gate insulating film) gave the following data.

(1) The sub-threshold coefficient as the index of switching performance (rapidity of on/off switching) is as small as 80–150 mV/decade (typically 100–120 mV/decade) in both N-channel type TFT and P-channel type TFT.

(2) The electric field effect mobility ($\mu_{FE}$) as the index of the operating speed of TFT is as large as 150–650 cm$^2$/Vs (typically 200–500 cm$^2$/Vs) for N-channel type TFT and as large as 100–300 cm$^2$/Vs (typically 120–200 cm$^2$/Vs) for P-channel type TFT.

(3) The threshold voltage ($V_{th}$) as the index of the driving voltage of TFT is as small as −0.5 to 1.5V for N-channel type TFT and as small as −1.5 to 0.5V for P-channel type TFT.

As mentioned above, it has been confirmed that extremely good switching characteristics and high-speed operating characteristics can be realized.

Embodiment 2

Embodiment 2 shows, with reference to FIGS. 6A–6D, what type of TFT should be used for what type of circuits.

AM-LCD differs in minimum operating voltage (source voltage) depending on circuits. The operating voltage in the pixel portion is as high as 14–20V when the voltage applied to liquid crystal and the voltage to drive pixel TFT are combined together. Therefore, it is necessary to use TFT which withstands such a high voltage.

On the other hand, an operating voltage of about 5–10V is enough for the shift register circuit used for the source driving circuit and the gate driving circuit. The advantage of low operating voltage is good compatibility with external signals and low power consumption. However, the above-mentioned TFT capable of withstanding high voltage sacrifices the operating speed; therefore, it is not suitable for those circuits, such as shift register circuit, which require high-speed operation.

As mentioned above, the circuits formed on the substrate are divided into two groups according to objects: one for TFT which needs good withstand voltage characteristics and one for TFT which needs high operating speed.

Figure 6A:
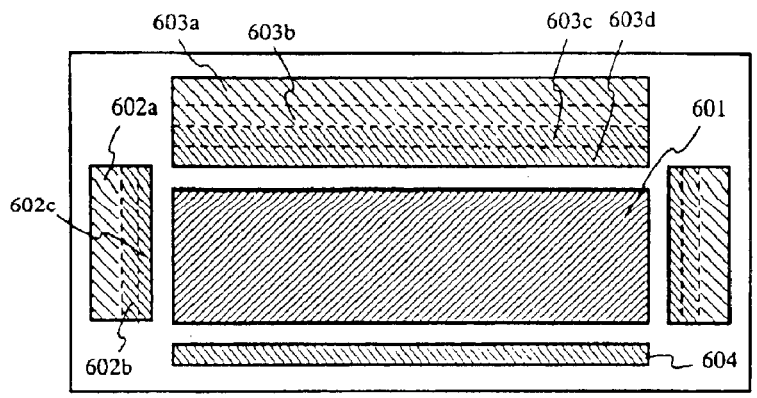

A typical construction in this embodiment is shown in FIGS. 6A–6D. FIG. 6A is a block diagram (top view) of AM-LCD. There is shown the pixel portion 601, in which the pixel has the pixel TFT and the storage capacitance. It functions as the image display portion. There are shown the shift register circuit 602a, the level shifter circuit 602b, and the buffer circuit 602c. These circuits as a whole constitute the gate driving circuit.

AM-LCD shown in FIG. 6A has two gate driving circuits, with the pixel portion held between them, each having the same gate wiring. In other words, there is redundancy so that voltage can be applied to the gate wiring even though malfunction occurs in either of the gate driving circuits.

Also, there are shown the shift register circuit 603a, the level register circuit 603b, the buffer circuit 603c, and the sampling circuit 603d. These circuits as a whole constitute the source driving circuit. There is shown the precharge circuit 604, which is opposite to the source driving circuit, with the pixel portion interposed between them.

In the AM-LCD constructed as mentioned above, the shift register circuit 602a and 603a is a circuit which needs high-speed operation; it operates at a voltage of 3.3–10V (typically 3.3–5V) and it does not need high withstand voltage characteristics. Therefore, the gate insulating film should be as thin as 5–50 nm (preferably 10–30 nm).

FIG. 6B is a schematic diagram of CMOS circuit to be used for such circuits as shift register circuits and other signal processing circuits which need high-speed operation. In FIG. 6B, there are shown the gate insulating film 605a for NTFT and the gate insulating film 605b for PTFT. They have a small thickness of 5–50 nm (preferably 10–30 nm).

The length of the LDD region 606 should preferably be 0.1–0.5 μm (typically 0.2–0.3 μm). The LDD region may be omitted if the operating voltage is as low as 2–3V.

Figure 6C:
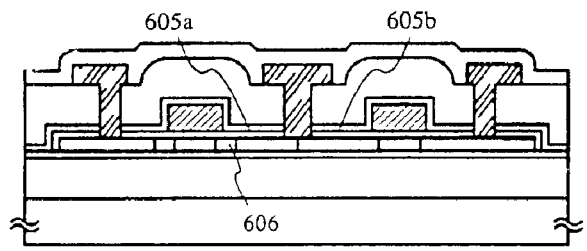
Figure 6C:
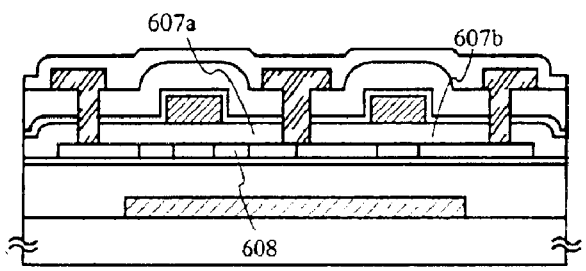

The CMOS circuit shown in FIG. 6C is suitable for the level shifter circuit 602b and 603b, the buffer circuit 602c and 603c, the sampling circuit 603d, and the precharge circuit 604. These circuits are designed to work at a high voltage of 14–16V so that they pass a large amount of current. Particularly, the gate driving side sometimes needs an operating voltage as high as 19V. This situation calls for TFT having very good withstand voltage characteristics.

The CMOS circuit shown in FIG. 6C is designed such that the gate insulting film 607a for NTFT and the gate insulating film 607b for PTFT have a thickness of 50–200 nm (preferably 100–150 nm). This circuit, which needs good withstand voltage characteristics, should preferably have a thicker gate insulating film than the shift register circuit shown in FIG. 4B.

The length of the LDD region 608 should preferably be 0.5–3 μm (typically 2–2.5 μm). The CMOS circuit shown in FIG. 6C receives a high voltage (equal to that of pixel), like the buffer circuit. Therefore, the length of the LDD region should preferably be equal to or close to that of the pixel.

Figure 6D:
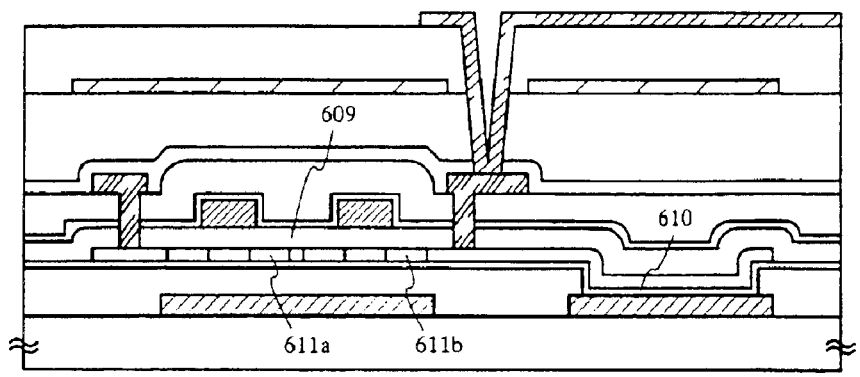

FIG. 6D is a schematic diagram of the pixel portion 601. The pixel TFT needs an operating voltage of 14–16V, including the voltage to be applied to the liquid crystal. In addition, it should have a minimum of off current because it has to hold the charge stored in the liquid crystal and storage capacitance for one-frame period.

For the reason mentioned above, the one in this embodiment is of double-gate structure with NTFT and the gate insulating film 609 has a thickness of 50–200 nm (preferably 100–150 nm). This film thickness may be equal to or different from that of the CMOS circuit shown in FIG. 6C.

Incidentally, the film thickness of the dielectric 610 for the storage capacitance is 5–75 nm (preferably 20–50 nm).

The length of the LDD regions 611a and 611b should preferably be 1–4 µm (typically 2–3 µm). The pixel TFT shown in FIG. 6D receives a high voltage of 14–16V; therefore, the length of the LDD regions should be rather long.

In addition, the pixel TFT should have as low off current as possible (drain current which flows when TFT in off state). Therefore, each of the LDD regions 611a and 611b should have such a region (1–3 µm) which does not overlap with the gate wiring. This region functions as the ordinary LDD region.

As shown above with reference to AM-LCD, various circuits are formed on the same substrate and they differ in operating voltage (or source voltage) they need. An effective way to cope with this situation is to arrange TFTs designed such that the gate insulating film differs in thickness or the LDD region differs in length between the driving circuit portion and the pixel portion, as in the case of this embodiment.

The construction shown in Embodiment 2 will be effectively realized by using the circuit shown in Embodiment 1.

Embodiment 3

Figure 7:
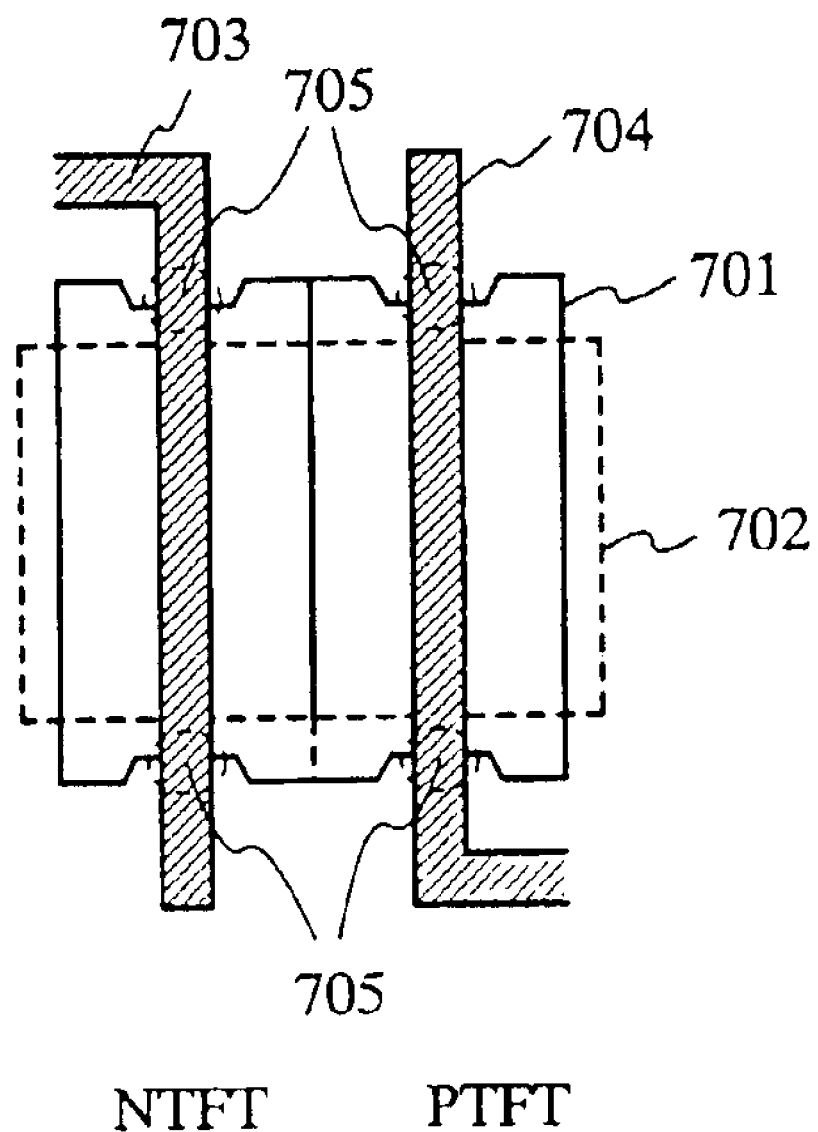
FIG. 7 is a diagram showing the structure of the driving TFT (CMOS circuit) of Embodiment 3.

The process shown in Embodiment 1 includes a step of removing the gate insulating film selectively. In the region to become the driving TFT, this step should preferably be carried out, as shown in FIG. 7. In FIG. 7, there are shown the active layer 701, the end 702 of the gate insulating film 217, and the gate wirings 703 and 704. As shown in FIG. 7, the gate wiring gets over the active layer at 705. The gate insulating film should preferably be partly left at the end of the active layer 701.

The end of the active layer 701 is subject to "edge thinning" in the thermal oxidation step to be carried out afterward. "Edge thinning" is a phenomenon that oxidation reaction proceeds as if it creeps under the end of the active layer, with the end becoming thin and warping upward. This phenomenon makes the gate wiring break easily when it gets over the thinned edge.

It is possible to prevent the phenomenon of edge thinning from occurring at the portion 705 where the gate wiring gets over the gate insulating film, if the gate insulating film is removed in such a way as shown in FIG. 7. Therefore, it is possible to previously prevent the problem with the breaking of the gate wiring. Incidentally, the construction in Embodiment 3 may be effectively utilized in Embodiment 1.

Embodiment 4

Figure 8:
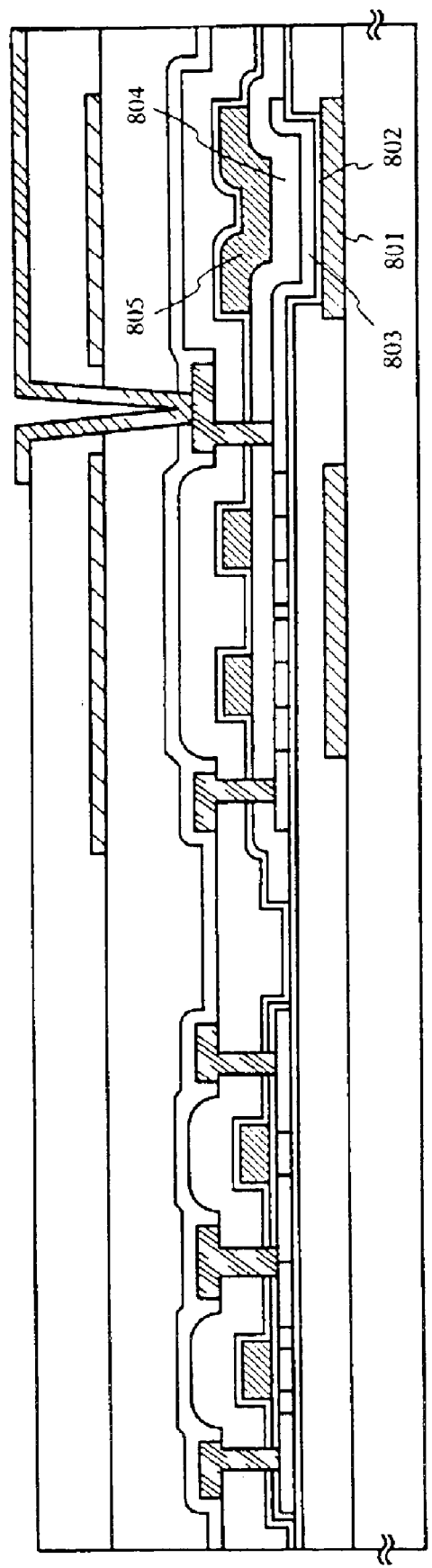
FIG. 8 is a diagram showing the sectional structure of AM-LCD of Embodiment 4.

Embodiment 4 demonstrates a modification of the structure of AM-LCD shown in FIG. 1. The modified structure is shown in FIG. 8. In this structure, the capacity wiring which has been formed simultaneously with the gate wiring is used as the electrode for the storage capacitance.

In the structure shown in FIG. 8, the first electrode 801, the first dielectric 802, and the second electrode 803 form the first storage capacitance, and the second electrode 803, the second dielectric 804, and the third electrode 805 form the second storage capacitance. The second dielectric 804 is an extension of the gate insulating film, and the third electrode 805 is formed simultaneously with the gate wiring.

The two units of storage capacitance connected in parallel provide a large retention capacity. In this case, the first electrode 801 and the third electrode 805 should be at a different or identical fixed potential.

The construction in this embodiment can be realized simply by providing the third electrode in Embodiment 1. The construction in Embodiment 4 may be combined freely with the construction of Embodiments 2 and 3.

Embodiment 5

Embodiment 5 demonstrates the actual production of AM-LCD in which TFT is formed on the substrate according to the steps shown in Embodiment 1.

In the state shown in FIG. 5B, an orientation film (80 nm thick) is formed on the pixel electrode 265. An opposite substrate is produced by forming on a glass substrate a color filter, a transparent electrode (an opposed electrode), and an orientation film. The orientation film undergoes rubbing treatment. The substrate (with TFTs formed thereon) and the opposite substrate are bonded together with a sealing agent, and a liquid crystal is held between them. The step for cell assembling can be accomplished in any known way. Its detailed description is omitted.

A spacer may be employed to maintain the cell gap. Spacer may be omitted in the case of small AM-LCD with a diagonal smaller than 1 inch.

Figure 10:
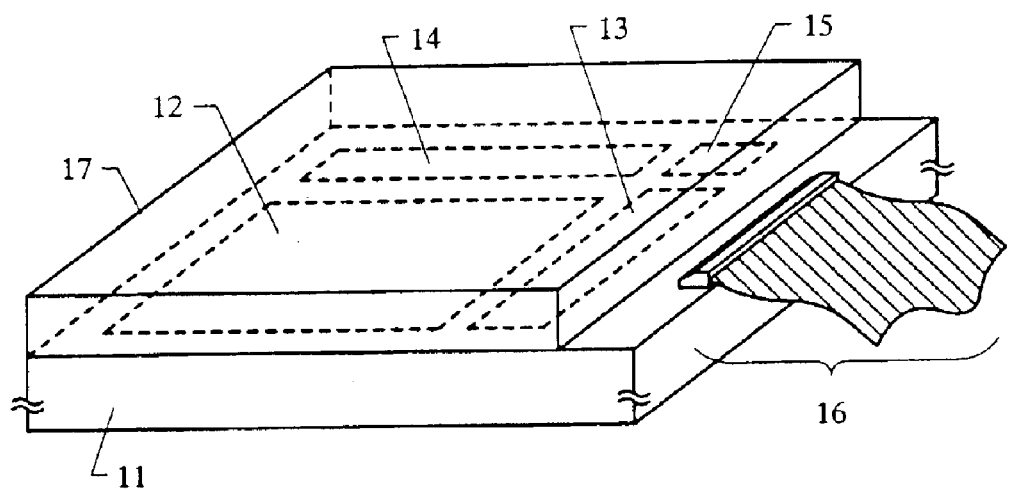
FIG. 10 is a diagram showing the external appearance of AM-LCD of Embodiment 5.

The AM-LCD produced as mentioned above has an external appearance as shown in FIG. 10. There is shown the active matrix substrate 11 (the substrate on which TFTs are formed). This substrate has formed thereon the pixel portion 12, the source driving circuit 13, the gate driving circuit 14, and the signal processing circuit 15 (a signal dividing circuit, a D/A converter circuit, a γ-correction circuit, a differential amplifying circuit, and the like). It is provided with FPC 16 (flexible print circuit). There is shown the opposite substrate 17.

Incidentally, Embodiment 5 may be combined freely with any of Embodiments 1 to 4.

Embodiment 6

Embodiment 6 demonstrates the forming of the crystalline silicon film in a way different from that in Embodiment 1.

To be concrete, this embodiment employs the technique disclosed in Embodiment 2 of Japanese Patent Laid-open No. 7-130652 (corresponding to U.S. patent application Ser. No. 08/329,644) to crystallize the amorphous silicon film. This technique causes a catalyst element (typically nickel) for crystallization to be selectively held on the surface of the amorphous silicon film. The selected portion functions as nuclei for crystal growth.

According to this technique, it is possible to grow crystals in a specific direction and hence to form a crystalline silicon film with a very high crystallinity.

For the catalyst element to be selectively held, an insulating film for masking is provided. This insulating film can also be used as the mask for phosphorus to be added for gettering. This helps decrease the number of steps. A detailed description of this technique will be found in Japanese Patent Laid-open No. 10-247735 (corresponding to U.S. patent application Ser. No. 09/034,041) filed by the present applicant.

Incidentally, Embodiment 6 may be combined freely with any of Embodiments 1 to 5.

Embodiment 7

Figure 11:
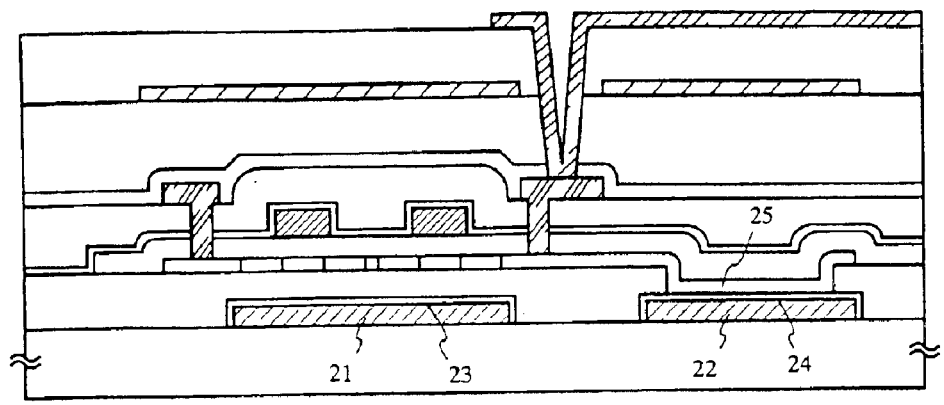
FIG. 11 is a diagram showing the sectional structure of AM-LCD of Embodiment 7.

Embodiment 7 demonstrates, with reference to FIG. 11, the forming of the storage capacitance which is different in structure from that in Embodiment 1. To be concrete, the dielectric for the storage capacitance is an oxide film which is obtained by oxidizing the lower electrode for the storage capacitance.

First, the substrate is processed so as to form thereon the light blocking film 21 and the lower electrode 22 for the storage capacitance. The same material as used in Embodiment 1 may be used. In this embodiment, a preferable material is one which forms a good insulating film when its upper surface is oxidized.

In this embodiment, a laminate of three-layer structure is used. It is composed of a silicon film, a tungsten film (or a tungsten silicide film), and a silicon film, arranged upward. Alternatively, it is composed of a tantalum film, a tantalum nitride film, and a tantalum film, arranged upward.

After the light blocking film 21 and the lower electrode 22 for the storage capacitance have been formed, oxide films 23 and 24 are formed on the surface by heat treatment, plasma treatment, or anodizing. In this embodiment, the oxide film is a silicon oxide film, and hence it is formed by heat treatment at 900° C. for 30 minutes. Incidentally, the oxide films 23 and 24 may be formed under adequate conditions which are selected according to the thickness and quality of the oxide film required.

In this embodiment, the storage capacitance is formed by the lower electrode 22 for the storage capacitance, the silicon oxide film 24 (formed by thermal oxidation), and the upper electrode (a semiconductor film) 25 for the storage capacitance.

In the case where the lower electrode 22 for the storage capacitance is a laminate of three-layer structure which is composed of a tantalum film, a tantalum nitride film, and a tantalum film, arranged upward, the oxide film 24 is a tantalum oxide film and hence it is possible to obtain a dielectric having a very high relative permittivity. Therefore, it provides a very large capacity with a small area.

Incidentally, Embodiment 7 may be combined freely with any of Embodiments 1 to 6.

Embodiment 8

Figure 12:
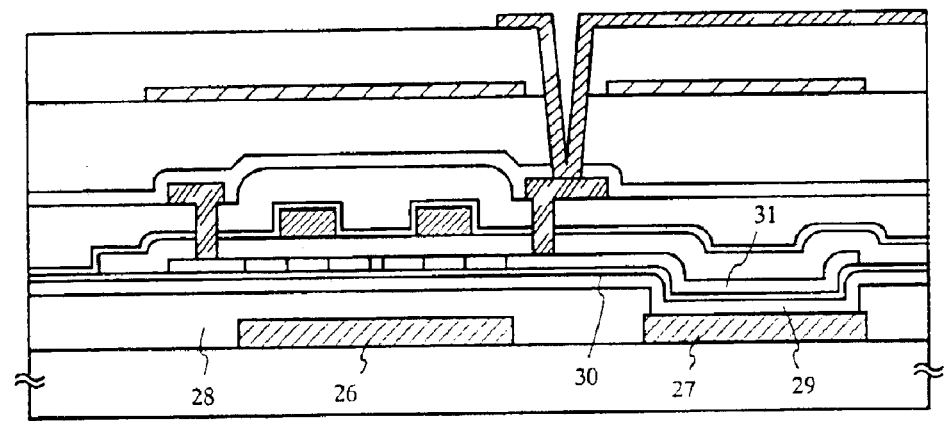
FIG. 12 is a diagram showing the sectional structure of AM-LCD of Embodiment 8.

Embodiment 8 demonstrates, with reference to FIG. 12, the forming of the storage capacitance which is different in structure from that in Embodiment 1. To be concrete, the dielectric for the storage capacitance is a tantalum oxide film.

In FIG. 12, there are shown the light blocking film 26, the lower electrode 27 for the storage capacitance, and the underlying film (a silicon oxide film) 28. Description of their materials may be found in Embodiment 1. In this embodiment, an opening is formed in the underlying film 28 and subsequently the tantalum oxide film 29 is formed by sputtering. The film thickness is 10–100 nm (preferably 30–50 nm).

Alternatively, an opening is formed and then the exposed lower electrode 27 for the storage capacitance is oxidized by heat treatment, plasma treatment, or anodizing to form the tantalum oxide film.

After the tantalum oxide film 29 has been formed, the thin silicon oxide film 30 (about 10 nm thick) and the upper electrode 31 for the storage capacitance are formed. It is desirable to form continuously the silicon oxide film 30 and the amorphous silicon film (or a semiconductor film which becomes later the upper electrode for the storage capacitance) without opening the chamber. The procedure in this way protects the lower surface of the active layer (which is adjacent to the upper electrode) from contamination with boron etc. contained in the atmosphere.

Also, this silicon oxide film 30 functions as a barrier layer which prevents mutual reaction between the tantalum oxide film 29 and the upper electrode 31 for the storage capacitance which is a semiconductor film (or a silicon film).

As mentioned above, this embodiment employs a laminate layer of the tantalum oxide film 29 and the silicon oxide film 30 as the dielectric for the storage capacitance. Since the tantalum oxide film 29 has a large relative permittivity (about 25), the dielectric provides a sufficiently large capacity even though its thickness is about 100 nm. The thickness should preferably be as thin as 30–50 nm, with the dielectric strength taken into account.

Incidentally, Embodiment 8 may be combined freely with any of Embodiments 1 to 7.

Embodiment 9

Figure 13:
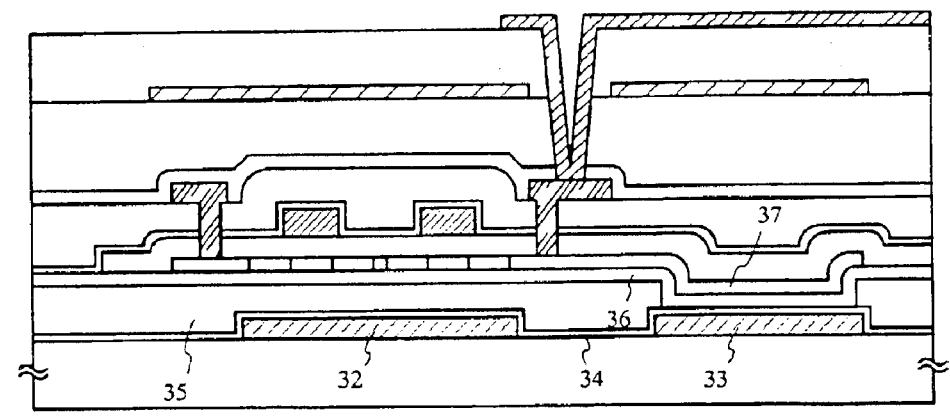
FIG. 13 is a diagram showing the sectional structure of AM-LCD of Embodiment 9.

Embodiment 9 demonstrates, with reference to FIG. 13, the forming of the storage capacitance which is different in structure from that in Embodiment 1. To be concrete, before the dielectric for the storage capacitance is formed, an insulating film as an etching stopper is formed.

In FIG. 13, there are shown the light blocking film 32, the lower electrode 33 for the storage capacitance, and the tantalum oxide film 34 (20 nm thick) that covers them. Description of the materials of the light blocking film 32 and the lower electrode 33 for the storage capacitance may be found in Embodiment 1. The tantalum oxide film may be formed by sputtering or by oxidizing the lower electrode 33 for the storage capacitance.

On them is formed the underlying film 35 (which is a silicon oxide film). In the underlying film 35 is formed an opening. The etching of the underlying film 35 is completely stopped by the tantalum oxide film 34. Therefore, the electrode 33 underneath is not etched and the film thickness is uniform in the opening in the tantalum oxide film 34.

After the opening has been formed, the dielectric (a silicon oxide film in this embodiment) 36 for the storage capacitance is formed. On the dielectric is formed the upper electrode (a semiconductor film) 37 for the storage capacitance.

In this embodiment, the etching stopper is a tantalum oxide film and the underlying film is a silicon oxide film. However, other insulating films may be used in combination if the film (as an etching stopper) and the underlying film have a sufficiently large etching selectivity (greater than 10, preferably greater than 100).

For example, if the underlying film is a silicon oxide film, then the etching topper may be a silicon nitride film.

In this embodiment, an opening is formed in the underlying film 35 and then a silicon oxide film (as the dielectric for the storage capacitance) is formed again. However, it is possible to use the tantalum oxide film (as the etching stopper) alone as the dielectric for the storage capacitance. In this case, it is desirable to interpose a thin silicon oxide film (as a barrier layer) between the tantalum oxide film and the upper electrode for the storage capacitance.

Needless to say, in the case where a silicon nitride film is used as the etching stopper, it is possible to use the silicon nitride film alone as the dielectric for the storage capacitance without specially forming a dielectric.

Incidentally, Embodiment 9 may be combined freely with any of Embodiments 1 to 8.

Embodiment 10

In Embodiment 1, phosphorus was used for the gettering of nickel (as a catalyst element to crystallize the silicon film). In Embodiment 10, other elements than phosphorus are used for the gettering of nickel.

The steps in Embodiment 1 are carried out until the stage shown in FIG. 2B is reached. In FIG. 2B, there is shown the crystalline silicon film 208. In this embodiment, nickel for crystallization is used in an extremely low concentration. To be concrete, a layer containing 0.5–3 ppm (by weight) of nickel is formed on the amorphous silicon film, and then heat treatment is carried out for crystallization. The nickel concentration in the crystalline silicon film is $1\times10^{17}$ to $1\times10^{19}$ atoms/cm$^3$ (typically $5\times10^{17}$ to $1\times10^{18}$ atoms/cm$^3$).

After the crystalline silicon film has been formed, heat treatment is carried out in an oxidizing atmosphere containing a halogen at 800–1150° C. (preferably 900–1000° C.) for 10 minutes to 4 hours (preferably 30 minutes to 1 hour).

In this embodiment, heat treatment is carried out at 950° C. for 30 minutes in an atmosphere composed of oxygen and 3–10 vol % of hydrogen chloride.

This heat treatment changes nickel in the crystalline silicon film into volatile nickel chloride, which diffuses into the treating atmosphere. In other words, nickel can be removed by the gettering action of halogen. If nickel is present in high concentrations in the crystalline silicon film, anomalous oxidation occurs in the portion where nickel segregates. Therefore, the nickel concentration should be kept as low as possible in the stage of crystallization.

Incidentally, Embodiment 10 may be combined freely with any of Embodiments 1 to 9.

Embodiment 11

Embodiment 11 demonstrates another AM-LCD which differs from that in Embodiment 1 in the structure of the CMOS circuit and pixel portion. To be concrete, the AM-LCD has the LDD region arranged differently according to the specifications required of the circuit.

The basic structure of the CMOS circuit and pixel portion is the same as that shown in FIG. 1. Therefore, reference numerals are given only to those parts specific to this embodiment.

Figure 14A:
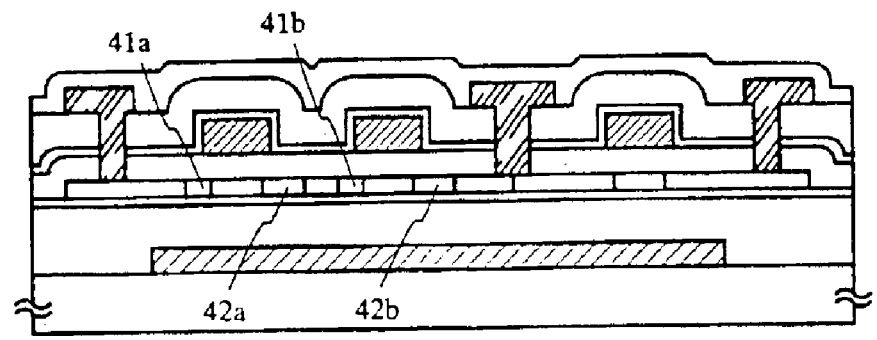
FIGS. 14A–14B are diagrams showing the sectional structure of the driving circuit and the pixel portion of Embodiment 11.

The circuit shown in FIG. 14A is a CMOS circuit for the buffer circuit in which NTFT is of double-gate structure and PTFT is of single-gate structure. In this embodiment, the LDD regions 41a and 41b at the source side are formed by self-alignment process in which the side wall alone is used as the mask. The LDD regions 42a and 42b at the drain side are formed by using a resist mask. Each of the latter LDD regions has a larger width (length) than each of the former LDD regions.

The CMOS circuit used for the driving circuit and the signal processing circuit needs high-speed operation. Therefore, any resistance component which lowers the operating speed should be eliminated as far as possible. However, the LDD regions necessary to enhance the hot carrier resistance function as the resistance component. Therefore, they sacrifice the operating speed.

However, it is at the end at the drain region side of the channel forming region that hot carriers are injected. Therefore, it is a good countermeasure for hot carriers to form in that part the LDD region which overlaps with the gate electrode, with the gate insulating film interposed between them. Consequently, it is not always necessary to form the LDD region more than required at the end at the source region side of the channel forming region.

Incidentally, the structure shown in FIG. 14A cannot be applied to the case of action like the pixel TFT in which the source region and the drain region are interchanged. In the case of a CMOS circuit, the source region and the drain region are fixed; therefore, it is possible to realized the structure as shown in FIG. 14A.

The structure as mentioned above eliminates the resistance component due to the LDD region at the source region side, and the double-gate structure disperses and relieves the electric field applied across the source and the drain.

Figure 14B:
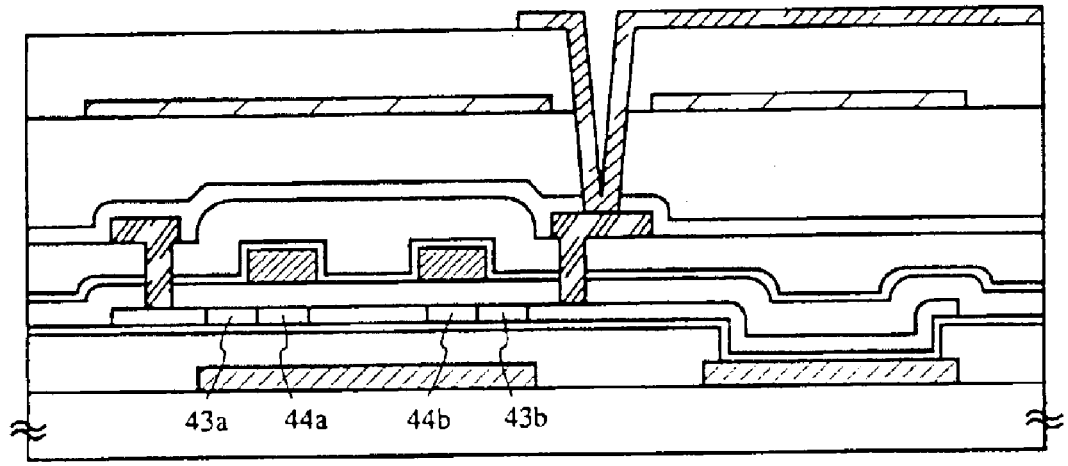

FIG. 14B shows the structure of the pixel portion according to one embodiment. In the case of the structure shown in FIG. 14B, the LDD regions 43a and 43b are formed only at one side close to the source region or the drain region. In other words, the LDD region is not formed between the two channel forming regions 44a and 44b.

In the case of a pixel TFT, the source region and the drain region are interchanged frequently because charging and discharging are repeated. Therefore, the structure shown in FIG. 14B is equivalent to forming the LDD region at the drain region side of the channel forming region no matter which becomes the drain region. Conversely, since an electric field does not concentrate in the region between the channel forming regions 44a and 44b, eliminating the LDD region (which becomes the resistance component) is an effective way to increase the on-current (the current which flows when the TFT is ON).

Incidentally, Embodiment 11 may be combined freely with any of Embodiments 1 to 10.

Embodiment 12

Figure 15A:
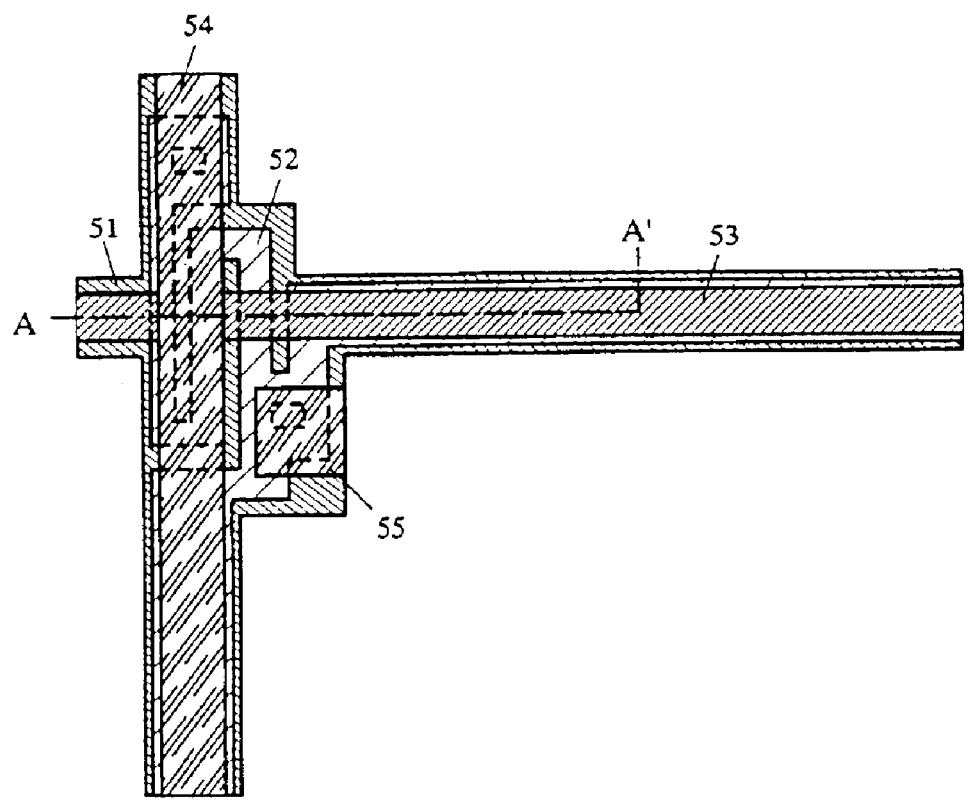
FIGS. 15A–15B are diagrams showing the top structure of the pixel portion of Embodiment 12.
Figure 15B:
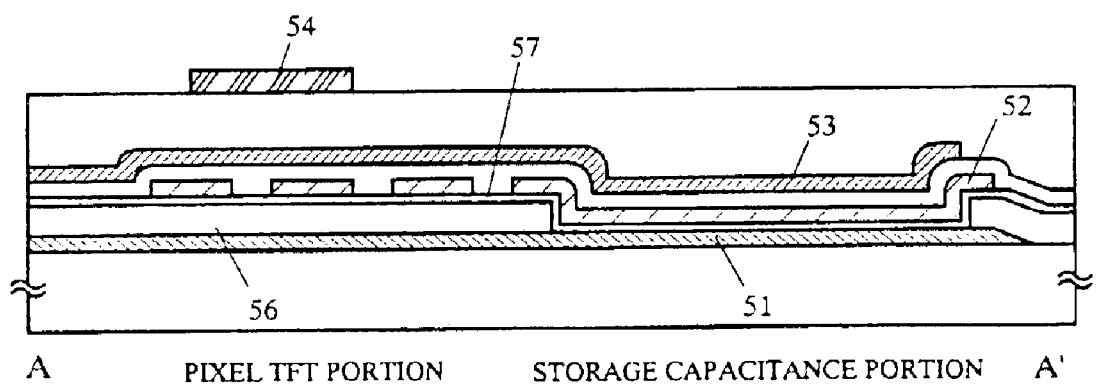

Embodiment 12 explains an embodiment relating to the position where the storage capacitance is formed in the pixel portion. For explanation, FIGS. 15A and 15B are used. Incidentally, FIG. 15B is a sectional view taken along the line A–A' in FIG. 15A. The same numerals are used for the same parts in FIGS. 15A and 15B.

In FIG. 15A, there are shown the lower electrode 51 for the storage capacitance which is formed simultaneously with the light blocking film, the semiconductor film 52, the gate wiring 53, the source wiring 54, and the drain wiring (drain electrode) 55.

The lower electrode 51 for the storage capacitance is formed such that it overlaps with the gate wiring 53 and the source wiring 54, and it has a mesh pattern (in matrix form). In other words, all the lower electrodes 51 for the storage capacitance are at the same potential (preferably at the minimum source potential).

On it are formed the underlying film 56 and the semiconductor film 52, with the insulating film 57 interposed between them. (The insulating film 57 becomes later the dielectric for the storage capacitance.) Incidentally, in the storage capacitance portion, the underlying film 56 is removed and the storage capacitance is formed by the lower electrode 51 for the storage capacitance, the insulating film 57, and the semiconductor film 52.

This embodiment is characterized in that the storage capacitance portion is formed under the gate wiring 53 and the source wiring 54. Such structure increases the aperture ratio and permits a bright image to be displayed. In addition, the storage capacitance is protected from light so that leakage of charge from the storage capacitance is prevented.

In this embodiment, the semiconductor film is patterned such that the pixel TFT becomes of triple-gate structure. However, this embodiment is not limited to that.

Incidentally, Embodiment 12 may be combined freely with any of Embodiments 1 to 11.

Embodiment 13

Figure 16A:
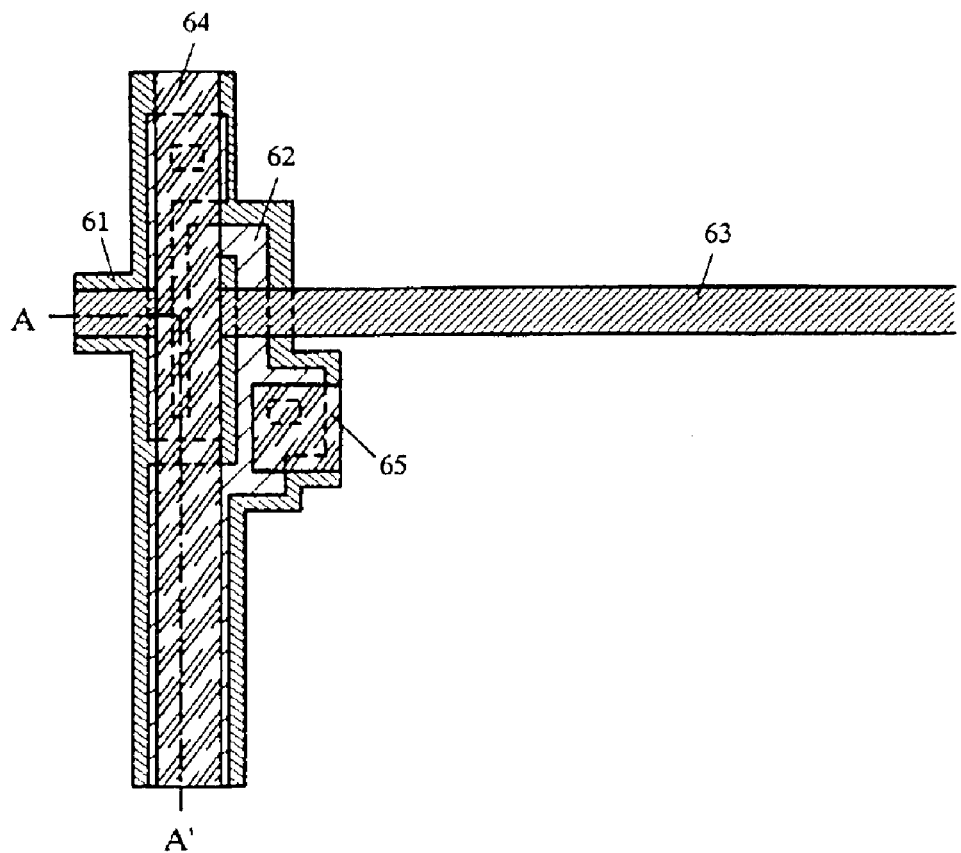
FIGS. 16A–16B are diagrams showing the top structure of the pixel portion of Embodiment 13.
Figure 16B:
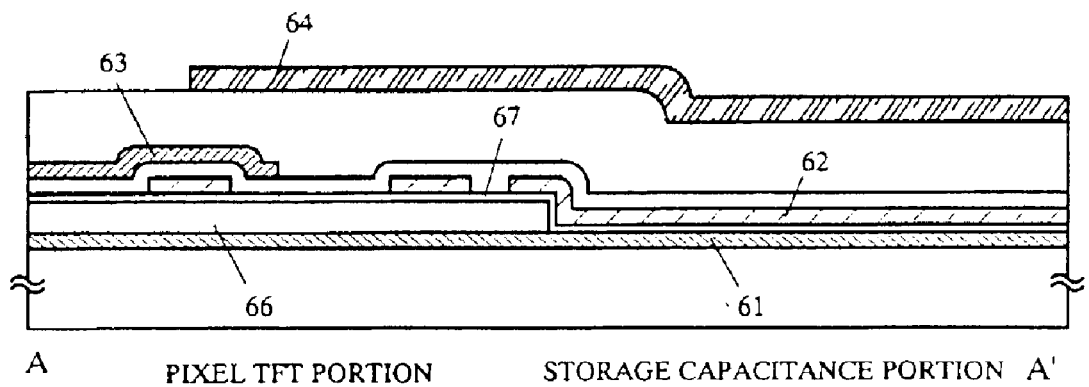

Embodiment 13 explains an embodiment relating to the position where the storage capacitance is formed in the pixel portion. For explanation, FIGS. 16A and 16B are used. Incidentally, FIG. 16B is a sectional view taken along the line A–A' in FIG. 16A. The same numerals are used for the same parts in FIGS. 16A and 16B.

In FIG. 16A, there are shown the lower electrode 61 for the storage capacitance which is formed simultaneously with the light blocking film, the semiconductor film 62, the gate wiring 63, the source wiring 64, and the drain wiring (drain electrode) 65.

The lower electrode 61 for the storage capacitance is formed such that it overlaps with the source wiring 64, and it has a mesh pattern (in matrix form). In other words, all the lower electrodes 61 for the storage capacitance are at the same potential (preferably at the minimum source potential).

On it are formed the underlying film 66 and the semiconductor film 62, with the insulating film 67 interposed between them. (The insulating film 67 becomes later the dielectric for the storage capacitance.) Incidentally, in the storage capacitance part, the underlying film 66 is removed and the storage capacitance is formed by the lower electrode 61 for the storage capacitance, the insulating film 67, and the semiconductor film 62.

This embodiment is characterized in that the storage capacitance part is formed under the source wiring 64. Such structure increases the aperture ratio and permits a bright image to be displayed. In addition, the storage capacitance is protected from light so that leakage of charge from the storage capacitance is prevented.

In this embodiment, the semiconductor film is patterned such that the pixel TFT becomes of triple-gate structure. However, this embodiment is not limited to that.

Incidentally, Embodiment 13 may be combined freely with any of Embodiments 1 to 11.

Embodiment 14

Embodiment 14 explains an embodiment relating to the position where the storage capacitance is formed in the pixel portion. For explanation, FIG. 17 is used.

Figure 17:
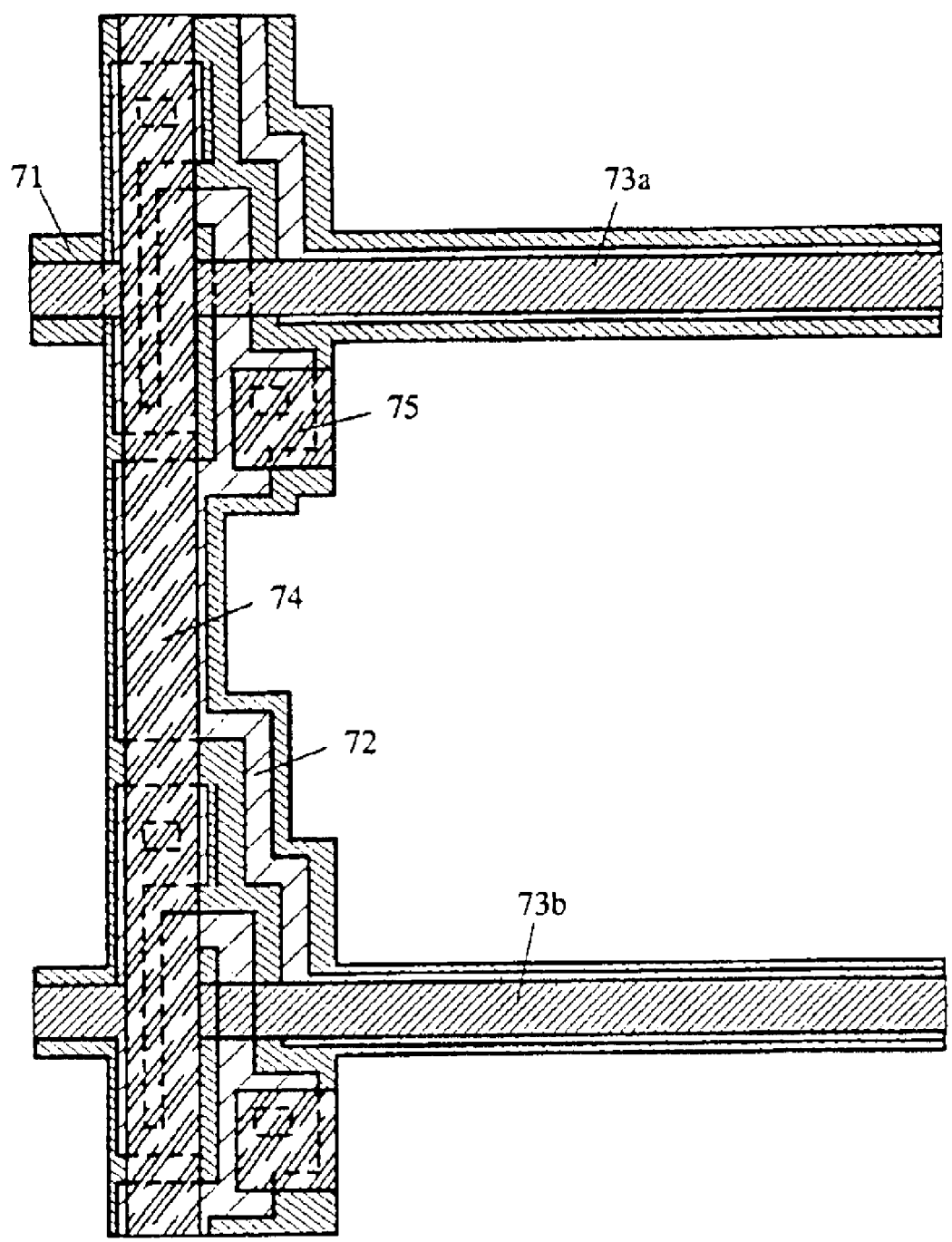
FIG. 17 is a diagram showing the top structure of the pixel portion of Embodiment 14.

In FIG. 17, there are shown the lower electrode 71 for the storage capacitance, the semiconductor film 72, the gate wirings 73a and 73b, the source wiring 74, and the drain wiring (drain electrode) 75.

The lower electrode 71 for the storage capacitance is formed such that it overlaps with the gate wirings 73a and 73b and the source wiring 74, and it has a mesh pattern (in matrix form). In other words, all the lower electrodes 71 for the storage capacitance are at the same potential (preferably at the minimum source potential).

On it is formed the semiconductor film 72, with the underlying film and the dielectric for the storage capacitance interposed between them. Incidentally, in the storage capacitance portion, the underlying film is removed and the storage capacitance is formed by the lower electrode 71 for the storage capacitance, the dielectric for the storage capacitance, and the semiconductor film 72.

This embodiment is characterized in that the storage capacitance portion is formed under the second wiring 73b and the source wiring 74. This embodiment differs from Embodiments 12 and 13 in that the storage capacitance is formed under either of the gate wiring which is not selected (or the gate wiring 73b adjacent to the gate wiring 73a which is selected).

In the case of this embodiment, when charge is stored in the storage capacitance portion, the gate wiring above it is not selected. Therefore, it is possible to prevent the fluctuation of the charge stored in the storage capacitance due to parasitic capacity.

Such structure increases the aperture ratio and permits a bright image to be displayed. In addition, the storage capacitance is protected from light so that leakage of charge from the storage capacitance is prevented.

In this embodiment, the semiconductor film is patterned such that the pixel TFT becomes of triple-gate structure. However, this embodiment is not limited to that.

Incidentally, Embodiment 14 may be combined freely with any of Embodiments 1 to 11.

Embodiment 15

Figure 18A:
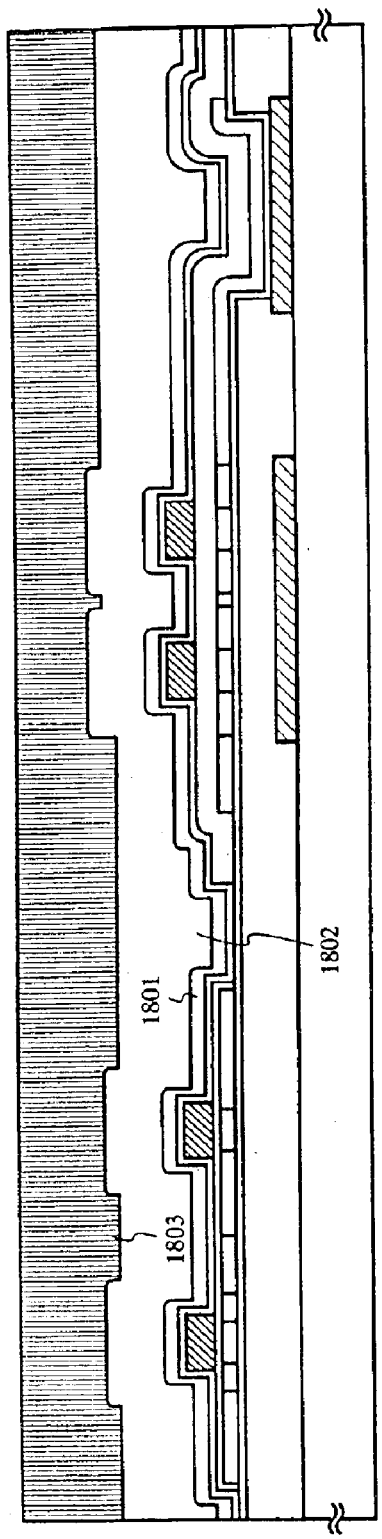
FIGS. 18A–18B are diagrams showing the process of producing AM-LCD of Embodiment 15.
Figure 18B:
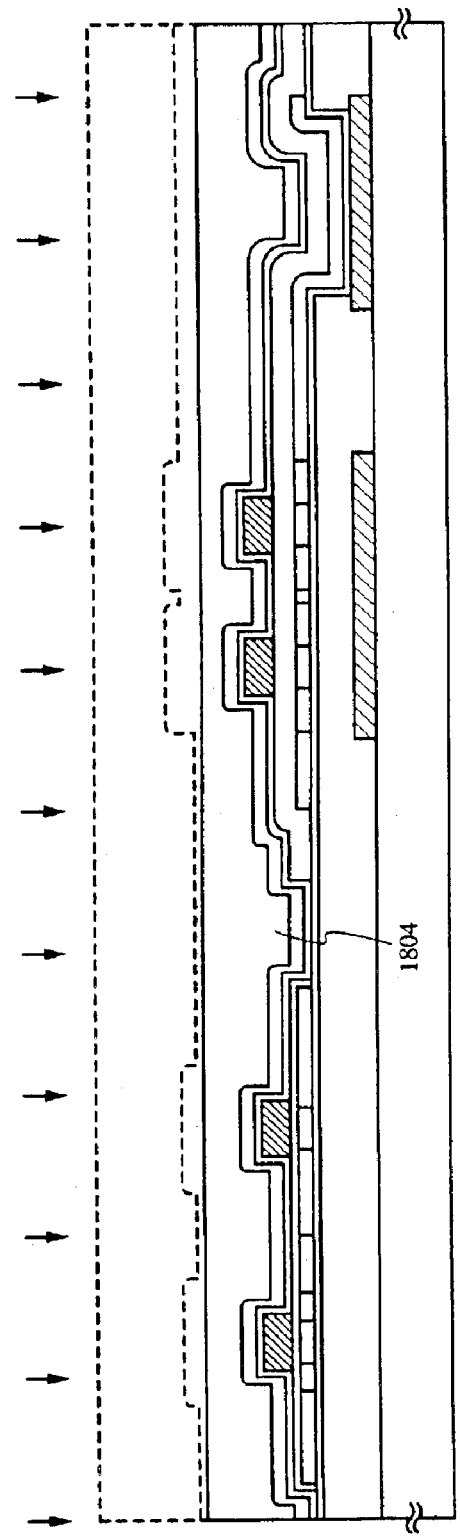

Embodiment 15 explains an embodiment in which the first interlayer insulating film is formed in a way different from that in Embodiment 1. For explanation, FIGS. 18A–18B are used.

The procedure in Embodiment 1 is followed until the activation step shown in FIG. 5A is completed. Then, a silicon nitride oxide film (A) 1801 is formed, which is 50–100 nm thick (70 nm thick in this embodiment). On it is formed a silicon nitride oxide film (B) 1802 is formed, which is 600 nm to 1 μm thick (800 nm thick in this embodiment). On it is further formed a resist mask 1803. See FIG. 18A.

Incidentally, the silicon nitride oxide film (A) 1801 and the silicon nitride oxide film (B) 1802 differ from each other in the composition of nitrogen, oxygen, hydrogen, and silicon contained therein. The silicon nitride oxide film (A) 1801 is composed of nitrogen 7%, oxygen 59%, hydrogen 2%, and silicon 32%. The silicon nitride oxide film (B) 1802 is composed of nitrogen 33%, oxygen 15%, hydrogen 23%, and silicon 29%. This composition is not limitative.

The resist mask 1803 is so thick as to completely flatten the surface of the silicon nitride oxide film (B) 1802.

Then, the resist mask 1803 and the silicon nitride oxide film (B) 1802 undergoes dry etching with a mixed gas of carbon tetrafluoride and oxygen. This dry etching proceeds at almost the same etching rate for both the resist mask 1803 and the silicon nitride oxide film (B) 1802.

This etching removes the resist mask 1803 completely and the silicon nitride oxide film (B) 1802 partly (up to a depth of 300 nm from the surface in this embodiment), as shown in FIG. 18B. As the result, the surface flatness of the resist mask 1803 affects directly the surface flatness of the silicon nitride oxide film (B) which has been etched.

Thus there is obtained the first interlayer insulating film 1804 which is extremely flat. In this embodiment, the first interlayer insulating film 1804 has a thickness of 500 nm. For the subsequent steps, refer to Embodiment 1.

Incidentally, Embodiment 15 may be combined freely with any of Embodiments 1 to 14.

Embodiment 16

The present invention can be applied when an interlayer insulating film is formed on the conventional MOSFET and then TFT is formed thereon. In other words, it is possible to realize a semiconductor device of three-dimensional structure in which reflection-type AM-LCD is formed on the semiconductor circuit.

Also, the above-mentioned semiconductor circuit may be one which is formed on an SOI substrate such as SIMOX, Smart-Cut (registered trade mark of SOITEC), and ELT-RAN (registered trade mark of Canon).

Incidentally, Embodiment 16 may be combined freely with any of Embodiments 1 to 14.

Embodiment 17

The present invention can be applied to an active matrix type EL display.

Figure 19:
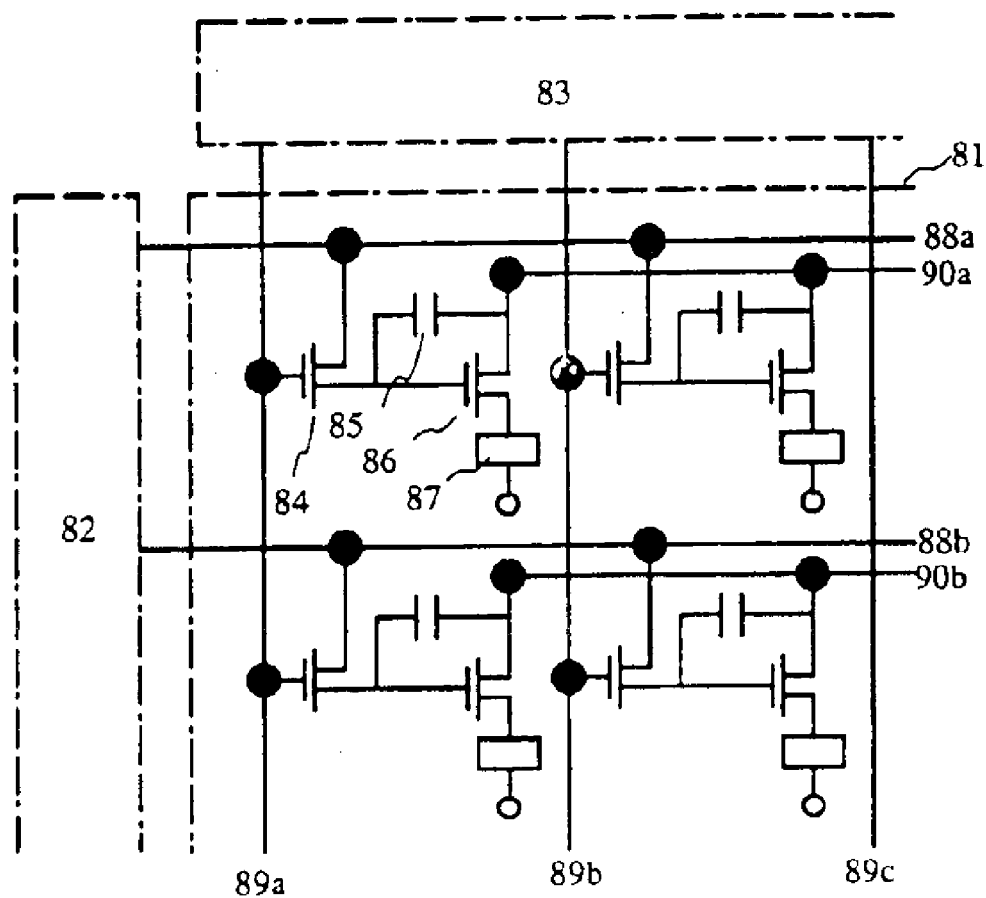
FIG. 19 is a diagram showing the circuit construction of the EL display device of Embodiment 17.

FIG. 19 is a circuit diagram of an active matrix type EL display. There are shown the display region 81, the X-direction (gate) driving circuit 82, and the Y-direction (source) driving circuit 83. Each pixel in the display region 81 has the TFT 84 for switching, the capacitor 85, the TFT 86 for current control, and the organic EL element 87. The TFT 84 for switching is connected to the X-direction (gate) signal line 88a (or 88b) and to the Y-direction (source) signal line 89a (or 89b, 89c). The TFT 86 for current control is connected to the source lines 90a and 90b.

The active matrix type EL display in this embodiment is characterized in that the gate insulating film of the TFT used for the X-direction driving circuit 82 and the Y-direction driving circuit 83 is thinner than that of the TFT 84 for switching and the TFT 86 for current control. The capacitor 85 is the storage capacitance of the same structure as shown in Embodiments 1, 4, 7, 8, and 9.

The active matrix type EL display in Embodiment 17 may be combined with any structure in Embodiments 1 to 16.

Embodiment 18

Embodiment 18 demonstrates an EL (electroluminescence) display device produced according to the present invention. Incidentally, FIG. 20A is a top view of the EL display device and the FIG. 20B is a sectional view of the same.

Figure 20A:
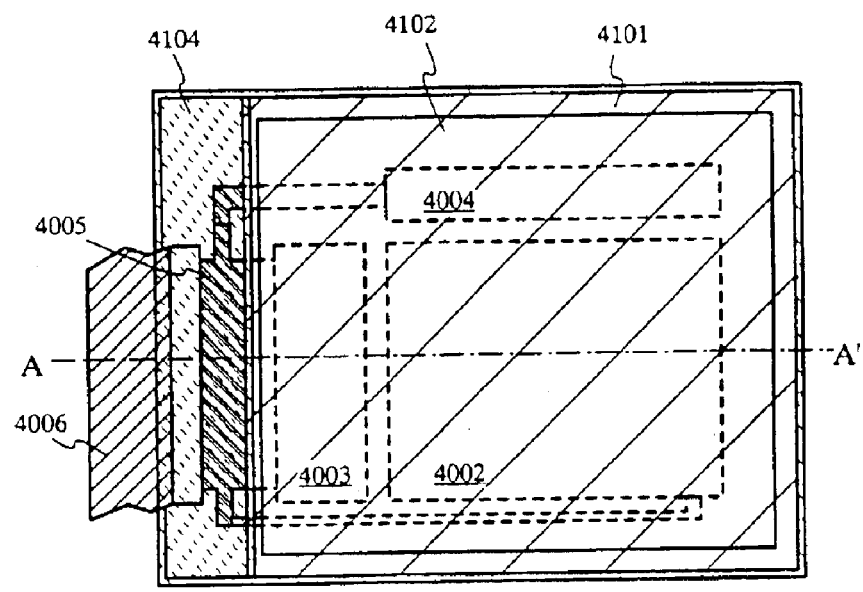
FIGS. 20A–20B are diagrams showing the top structure and the sectional structure of the EL display device of Embodiment 18.

In FIG. 20A, there are shown the substrate 4001, the pixel portion 4002, the source side driving circuit 4003, and the gate side driving circuit 4004. Each driving circuit is connected to the external device through the wiring 4005 and FPC (flexible print circuit) 4006.

The pixel portion 4002, the source side driving circuit 4003, and the gate side driving circuit 4004 are surrounded by the first sealing material 4101, the covering material 4102, the filling material 4103, and the second sealing material 4104.

Figure 20B:
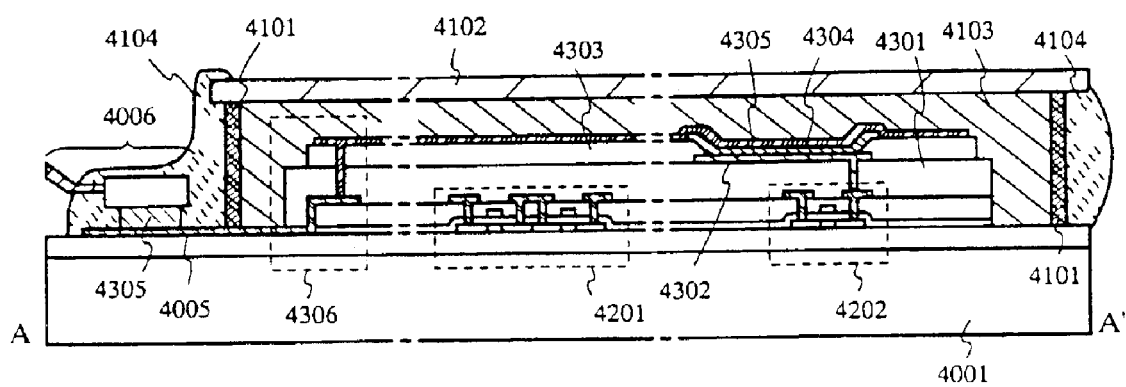

FIG. 20B is a sectional view taken along the line A–A' in FIG. 20A. On the substrate 4001 are formed the driving TFT 4201 and the pixel TFT 4202. The driving TFT 4001 (an n-channel type TFT and a p-channel type TFT are shown here) is contained in the source side driving circuit 4003. The pixel TFT is contained in the pixel portion 4002. (A TFT to control current to the EL element is shown here.)

In this embodiment, the driving TFT 4201 is the TFT of the same structure as the driving circuit shown in FIG. 1. And, the pixel TFT 4202 is the TFT of the same structure as the pixel portion shown in FIG. 1.

On the driving TFT 4201 and the pixel TFT 4202 is formed an interlayer insulating film (a leveling film) 4301. On it is formed the pixel electrode (cathode) 4302 which is electrically connected to the drain of the pixel TFT 4202. The pixel electrode 4302 may be a light blocking conductive film (typically conductive film composed mainly of aluminum, copper, or silver, or a laminate thereof with other conductive film). In this embodiment, an aluminum alloy film is used as the pixel electrode.

On the pixel electrode 4302 is formed the insulating film 4303. The insulating film 4303 has an opening formed on the pixel electrode 4302. In this opening, the EL (electroluminescence) layer 4304 is formed on the pixel electrode 4302. The EL layer 4304 may be formed from any known organic EL material or inorganic EL material. The organic EL material may be either a low-molecular material (monomer) or a high-molecular material (polymer).

The EL layer 4304 may be formed by any known technology. The EL layer may be of laminate-layer structure or single-layer structure consisting of a hole injection layer, a hole transport layer, a light emitting layer, an electron transport layer, and an electron injection layer.

On the EL layer 4304 is formed the anode 4305 of a transparent conductive film. The transparent conductive film may be formed from a compound of indium oxide and tin oxide or a compound of indium oxide and zinc oxide. It is desirable to remove as far as possible water and oxygen from the interface between the anode 4305 and the EL layer 4304. Therefore, they should be formed continuously in a vacuum. Alternatively, the EL layer 4304 should be formed in an atmosphere of nitrogen or rare gas and the anode 4305 should be formed such that it does not come into contact with oxygen and water. This embodiment employs the film-forming apparatus of multi chamber type (cluster tool type) which permits film to be formed as mentioned above.

The anode 4305 is electrically connected to the wiring 4005 in the region indicated by 4306. The wiring 4005 is intended to apply a prescribed voltage to the anode 4305, and it is electrically connected to the FPC 4006 through the electrically conductive material 4307.

In the above-mentioned way, the EL element is formed which is composed of the pixel electrode (cathode) 4302, the EL layer 4304, and the anode 4305. This EL element is surrounded by the first sealing material 4101 and the covering material 4102 (which is bonded to the substrate 4001 by the first sealing material 4101) and is enclosed by the filling material 4103.

The covering material 4102 may be glass plate, FRP (Fiberglass-Reinforced Plastics) plate, PVF (polyvinyl fluoride) film, Mylar film, polyester film, or acryl film. In this embodiment, a transparent material is used because the EL element emits light toward the covering material 4102.

However, it is not necessary to use a transparent material if the EL element emits light in the direction opposite to the covering material. In this case, it is possible to use a sheet of such structure in which a metal plate (typically stainless steel plate), ceramics plate, or aluminum foil is held between layers of PVF film or Mylar film.

Also, the filling material 4103 may be a UV light curing resin or thermosetting resin. It may also be PVC (polyvinyl chloride), acryl, polyimide, epoxy resin, silicone resin, PVB (polyvinyl butyral), or EVA (ethylene vinyl acetate). The filling material 4103 may be incorporated with a moisture absorbent (preferably barium oxide) so as to protect the EL element from deterioration. Incidentally, in this embodiment, a transparent material is used so that light from the EL eminent passes through the filling material 4103.

Also, the filling material 4103 may contain spacer. The spacer may be formed from barium oxide. In this case, the spacer itself is capable of moisture absorption. In the case where a spacer is used, pressure from the spacer may be relieved by a buffer layer which is a resin film formed on the anode 4305.

The wiring 4005 is electrically connected to the FPC 4006 though the conductive material 4305. The wiring 4005 transmits signals to the FPC 4006, wherein the signals are sent to the pixel portion 4002, the source side driving circuit 4003, and gate side driving circuit 4004. The wiring 4005 is electrically connected to the external device through the FPC 4006.

In this embodiment, the second sealing material 4104 is provided such that it covers the exposed portion of the first sealing material 4101 and a portion of the FPC 4006, so that the EL element is isolated completely from outside air. The resulting EL display device has a sectional structure as shown in FIG. 20B. Incidentally, the EL display device in this embodiment may be combined with any structure in Embodiments 1 to 4 and 6 to 16.

Embodiment 19

Figure 21A:
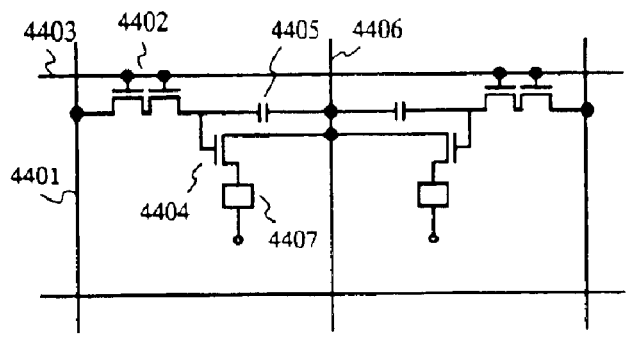
FIGS. 21A–21C are diagrams showing the pixel portion of the EL display device of Embodiment 19.
Figure 21B:
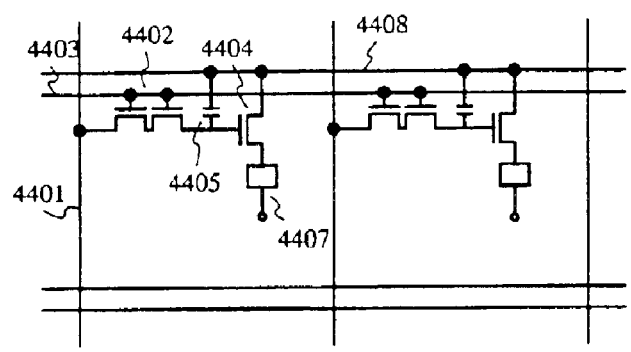
Figure 21C:
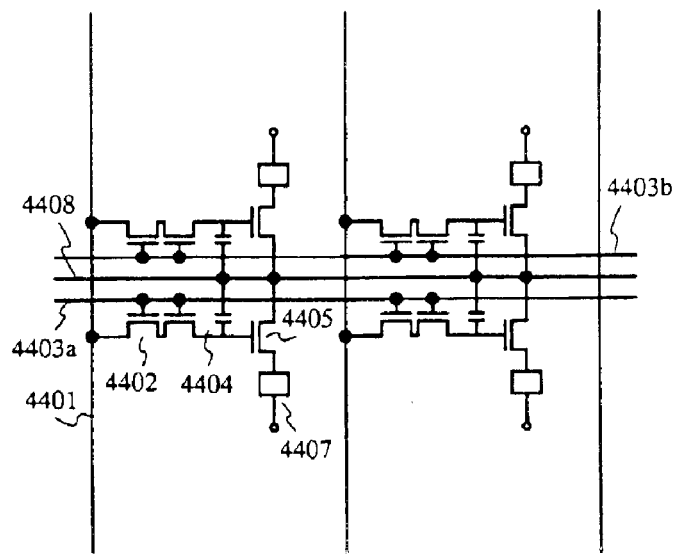

Embodiment 19 demonstrates an embodiment of the pixel structure that can be used for the pixel portion of the EL display device shows in Embodiment 18. The pixel structure is shown in FIGS. 21A to 21C. There are shown the source wiring 4401 of the TFT 4402 for switching, the gate wiring 4403 of the TFT 4402 for switching, the TFT 4404 for current control, the capacitor 4405, the current supply wirings 4406 and 4408, and the EL element 4407.

FIG. 21A shows the case in which the current supply wiring 4406 is used in common for the two pixels. In other words, it is formed such that two pixels are symmetric with respect to the current supplying wiring 4406. In this case it is possible to reduce the number of current supplying wirings and hence it is possible to make the pixel portion finer.

Also, FIG. 21B shows the case in which the current supplying wiring 4408 is arranged parallel to the gate wiring 4403. FIG. 21B shows a structure in which the current supplying wiring 4408 does not overlap with the gate wiring 4403. However, they may be formed such that they overlap with each other, with an insulating film interposed between them, if they are formed in different layers. In this case, the current supplying wiring 4408 and the gate wiring 4403 occupy a certain area in common, so that it is possible to make the pixel portion finer.

FIG. 21C shows the same structure as in FIG. 21B. The current supplying wiring 4408 is formed parallel to the gate wiring 4403 and two pixels are symmetric with respect to the current supplying wiring 4408. The current supplying wiring 4408 may overlap with either of the gate wiring 4403. In this case it is possible to reduce the number of current supplying wirings and hence it is possible to make the pixel portion finer.

Embodiment 20

The electro-optical equipment according to the present invention, or more specifically, the liquid crystal display device according to the present invention may employ a variety of liquid crystals in addition to nematic liquid crystal. Such liquid crystals are disclosed in the following, for example.

1998, SID, "Characteristics and Driving Scheme of Polymer-Stabilized Monostable FLCD Exhibiting Fast Response Time and High Contrast Ratio with Gray-Scale Capability" by H. Eurue at al.; 1997, SID DIGEST, 841, "A Full-Color Thresholdless Antiferroelectric LCD Exhibiting Wide Viewing Angle with Fast Response Time" by T. Yoshida at al.; 1996, J. Mater. Chem. 6(4), 671–673, "Thresholdless antiferroelectricity in liquid crystals and its application to displays" by S Inui et al.; U.S. Pat. No. 5,594,569.

Figure 22:
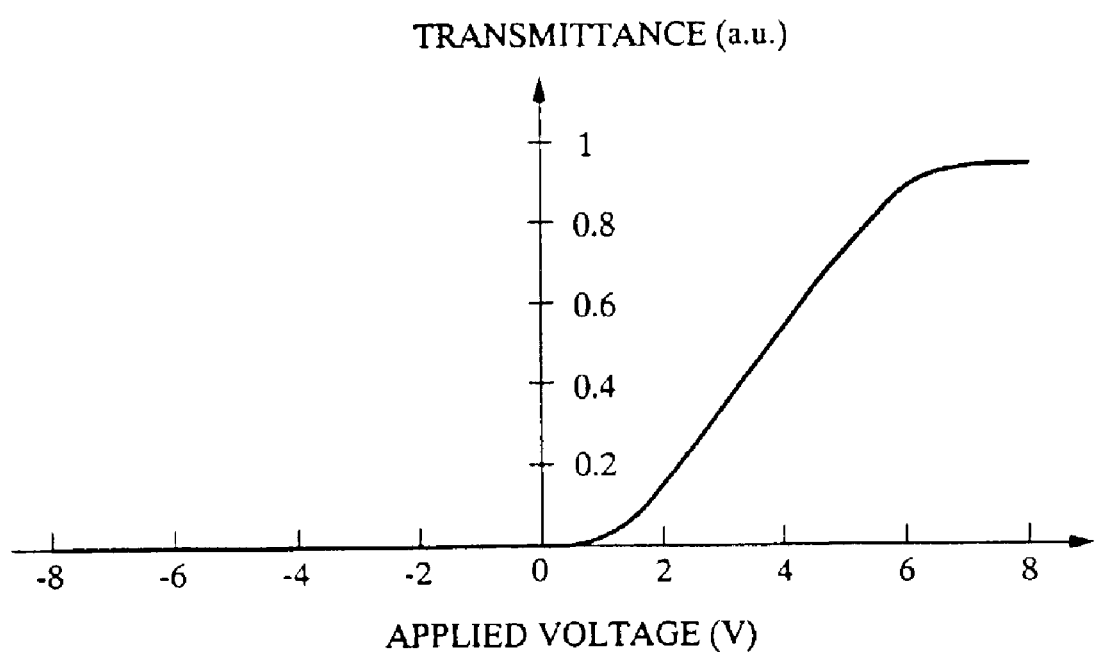
FIG. 22 is a diagram showing the optical response characteristics of liquid crystal of Embodiment 20.

FIG. 22 shows the electro-optical characteristics of the monostable FLC in which the liquid crystal is ferroelectric crystal (FLC) which exhibits the isotropic phase— choresteric phase—chiral smectic phase transition, the choresteric phase—chiral smectic phase transition takes place under application of DC voltage, and the cone edge is aligned approximately with the rubbing direction.

The display mode which the ferroelectric liquid crystal produces as shown in FIG. 22 is called "Half-V letter switching mode". In FIG. 22, the ordinate represents transmittance (in arbitrary unit) and the abscissa represents applied voltage. For more detail about "Half-V letter switching mode", refer to the following.

Terada et al., "Half-V letter switching mode FLCD", Preprints for the 46$^{th}$ Lecture Meeting of Applied Physics, March 1999, p. 1316; Yoshihara et al., "Time-sharing full-color LCD by ferroelectric liquid crystal", Liquid Crystal, vol. 3, No. 3, p. 190.

It is noted from FIG. 22 that the ferroelectric mixed liquid crystal permits low-voltage driving and gradation display. The liquid display device according to the present invention may employ a ferroelectric liquid crystal which exhibits such electro-optical characteristics.

A liquid crystal is referred to as an antiferroelectric liquid crystal (AFLC) if exhibits an antiferroelectric phase in a certain temperature range. A mixed liquid crystal containing an antiferroelectric liquid crystal exhibits the electro-optical response property that transmittance continuously changes with electric field. It is referred to as thresholdless antiferroelectric mixed liquid crystal. It includes some specifies which exhibit the so-called V-letter electro-optical response characteristics, with the driving voltage being about ±2.5V (cell thickness about 1–2 $\mu$m).

Usually, the thresholdless antiferroelectric mixed liquid crystal has a strong tendency toward spontaneous polarization and also has a high permittivity. Therefore, when it is used for a liquid crystal display device, the pixel should have a comparatively large storage capacitance. Consequently, it is desirable to use one which has a weak tendency toward spontaneous polarization.

If the thresholdless antiferroelectric mixed liquid crystal mentioned above is used for the liquid crystal display device according to the present invention, it is possible to drive the display device at a low voltage. This leads to power saving.

Incidentally, the liquid crystal shown in Embodiment 20 may also be used in the liquid crystal display device having the structure shown in any Embodiments 1 to 16.

Embodiment 21

The electro-optical device and semiconductor circuit according to the present invention may be used as the display and signal processing circuit of electric appliances, such a video camera, a digital camera, a projector, a projection TV, a goggle type display (a head mount display), a navigation system, an audio playback device, a note-type personal computer, a game machine, a portable information terminal (a mobile computer, a portable telephone, a portable game machine, and an electronic book), and a video reproducing device with a recording medium. Their examples are shown in FIGS. 23A to 25B.

Figure 23A:
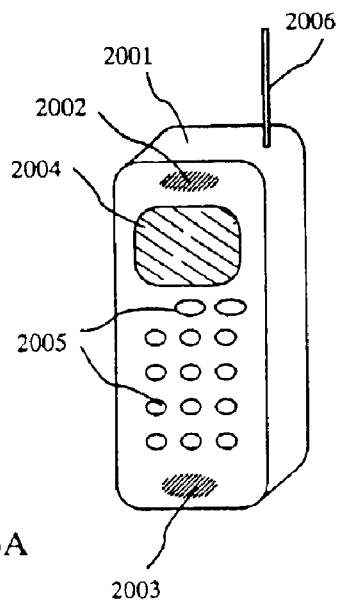
FIGS. 23A–23F are diagrams showing examples of electrical equipment of Embodiment 21.

FIG. 23A shows a portable telephone, which is made up of the main body 2001, sound output 2002, sound input 2003, display 2004, operating switch 2005, and antenna 2006. The electro-optical device according to the present invention may be applied to the display 2004, and the semiconductor circuit according to the present invention may be applied to the sound output 2002, sound input 2003, CPU, and memory.

Figure 23B:
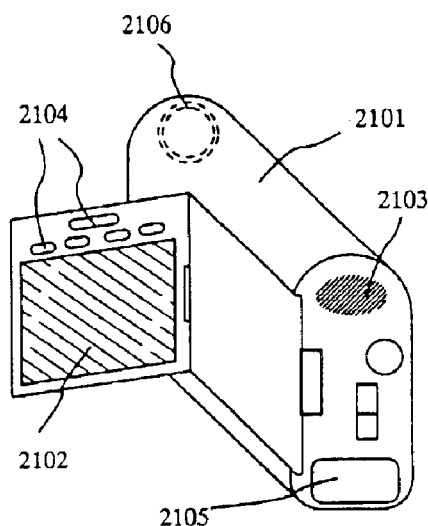

FIG. 23B shows a video camera, which is made up of the main body 2101, display 2102, sound input 2103, operating switch 2104, battery 2105, and image receiving unit 2106. The electro-optical device according to the present invention may be applied to the display 2102, the semiconductor circuit according to the present invention may be applied to the sound input 2103, CPU, and memory.

Figure 23C:
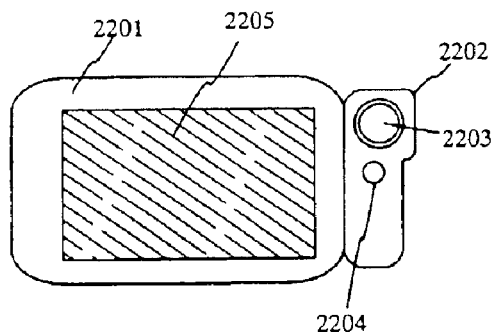

FIG. 23C shows a mobile computer, which is made up of the main body 2101, camera unit 2202, image receiving unit 2203, operating switch 2204, and display 2205. The electro-optical device according to the present invention may be applied to the display 2205, and the semiconductor circuit according to the present invention may be applied to the CPU and memory.

Figure 23D:
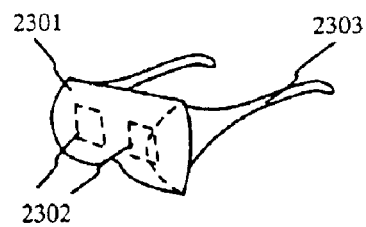

FIG. 23D shows a goggle type display, which is made up of the main body 2301, display 2302, and arm 2303. The electro-optical device according to the present invention may be applied to the display 2302, and the semiconductor circuit according to the present invention may be applied to the CPU and memory.

Figure 23E:
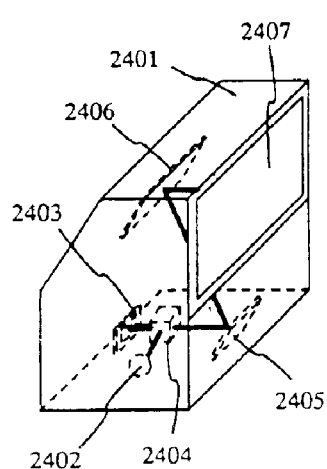

FIG. 23E shows a rear projector (projection TV), which is made up of the main body 2401, light source 2402, liquid crystal display 2403, polarized beam splitter 2404, reflectors 2405 and 2406, and screen 2407. The electro-optical device according to the present invention may be applied to the liquid crystal display 2403, and the semiconductor circuit according to the present invention may be applied to the CPU and memory.

Figure 23F:
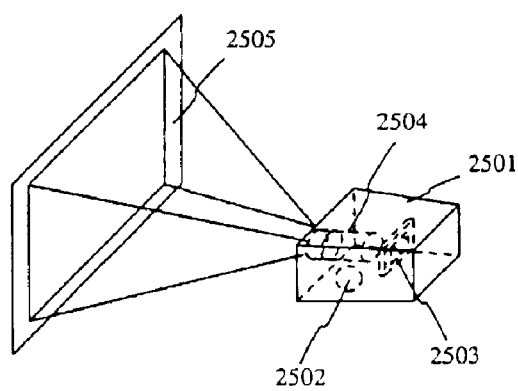

FIG. 23F shows a front projector, which is made up of the main body 2501, light source 2502, liquid crystal display 2503, optical system 2504, and screen 2505. The electro-optical device according to the present invention may be applied to the liquid crystal display 2502, and the semiconductor circuit according to the present invention may be applied to the CPU and memory.

Figure 24A:
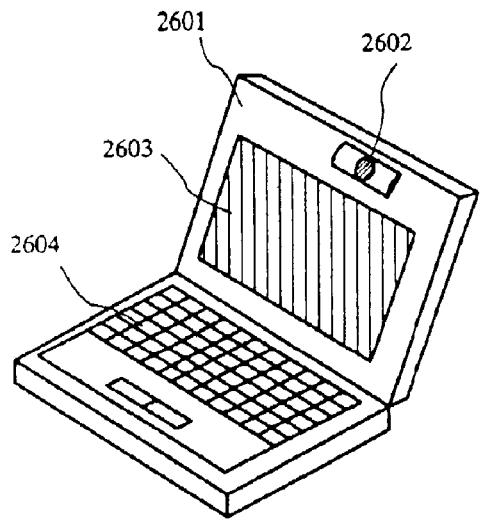
FIGS. 24A–24D are diagrams showing examples of electrical equipment of Embodiment 21.

FIG. 24A shows a personal computer, which is made up of the main body 2601, image input 2602, display 2603, and keyboard 2603. The electro-optical device according to the present invention may be applied to the display 2603, and the semiconductor circuit according to the present invention may be applied to the CPU and memory.

Figure 24B:
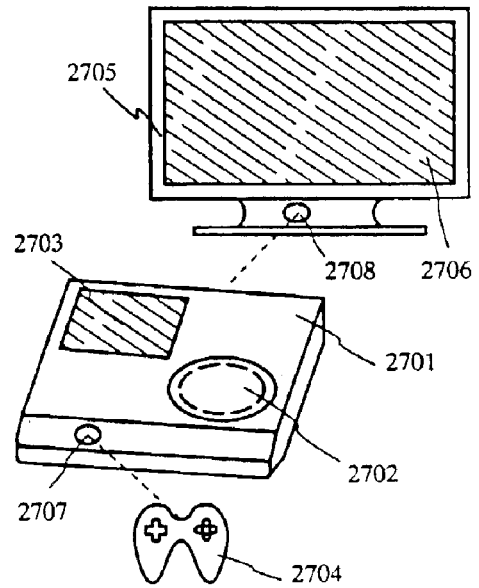

FIG. 24B shows an electronic game machine, which is made up of the main body 2701, recording medium 2702, display 2703, and controller 2704. The electronic game machine produces sound and image which are reproduced on the display (including the body 2705 and display device 2706). Communication between the controller 2704 and the main body 2701 or communication between the electronic game machine and the display is accomplished by wiring, wiringless, or light. The game machine in this embodiment is constructed such that infrared rays are detected by the sensors 2707 and 2708. The electro-optical device according to the present invention may be applied to the displays 2703 and 2706, and the semiconductor circuit according to the present invention may be applied to the CPU and memory.

Figure 24C:
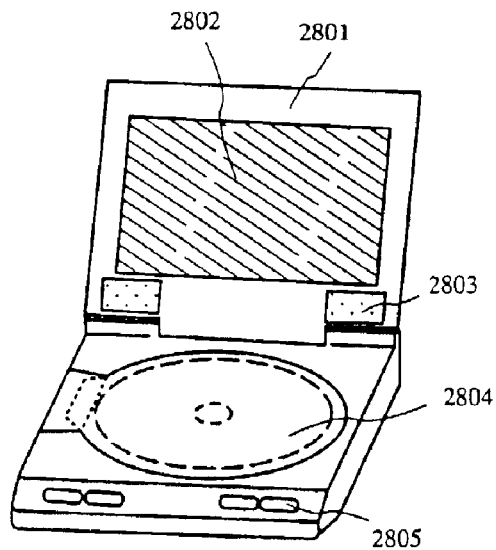

FIG. 24C shows a player (image reproduction device) with a program-recorded medium (or a recording medium), which is made up of the main body 2801, display 2802, speaker 2803, recording medium 2804, and operating switch 2805. This player employs DVD (Digital Versatile Disc) or CD as the recording medium. It permits one to enjoy music, movie, game, and Internet. The electro-optical device according to the present invention may be applied to the display 2802, CPU, and memory.

Figure 24D:
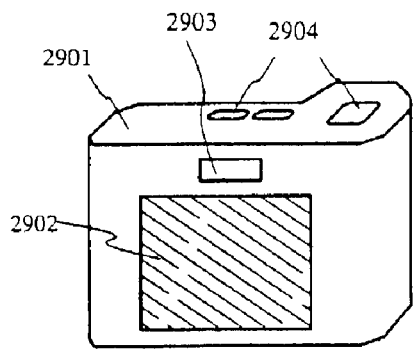

FIG. 24D shows a digital camera, which is made up of the main body 2901, display 2902, eyepiece 2903, operating switch 2904, and image receiving unit (not shown). The electro-optical device according to the present invention may be applied to the display 2902, CPU, and memory.

Figure 25A:
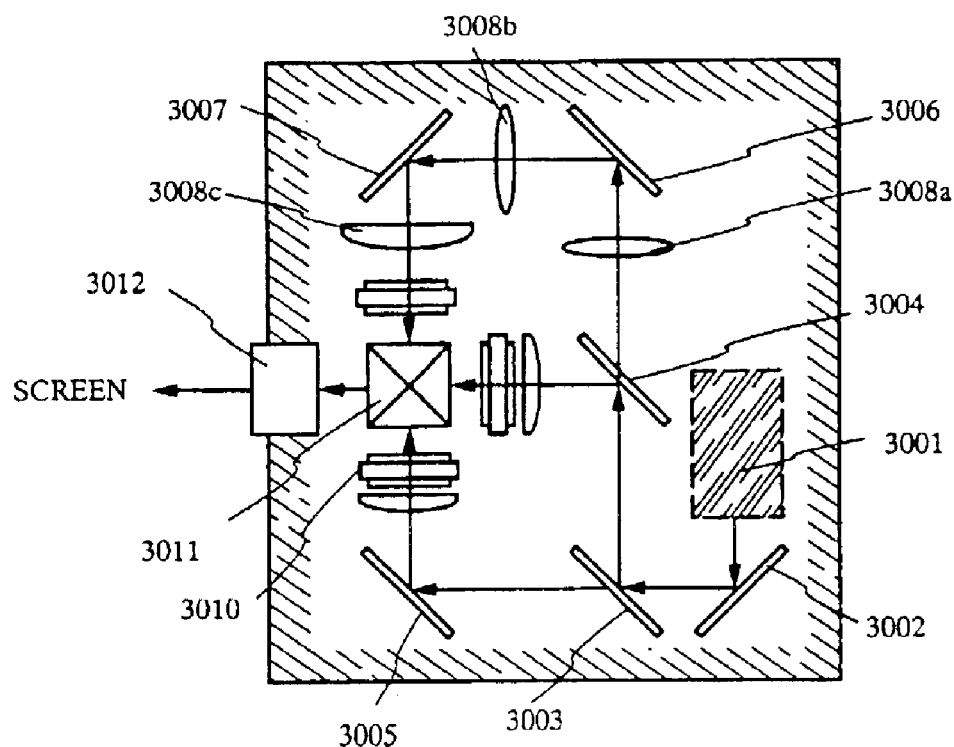
FIGS. 25A–25B are diagrams showing the construction of an optical engine of Embodiment 21.
Figure 25B:
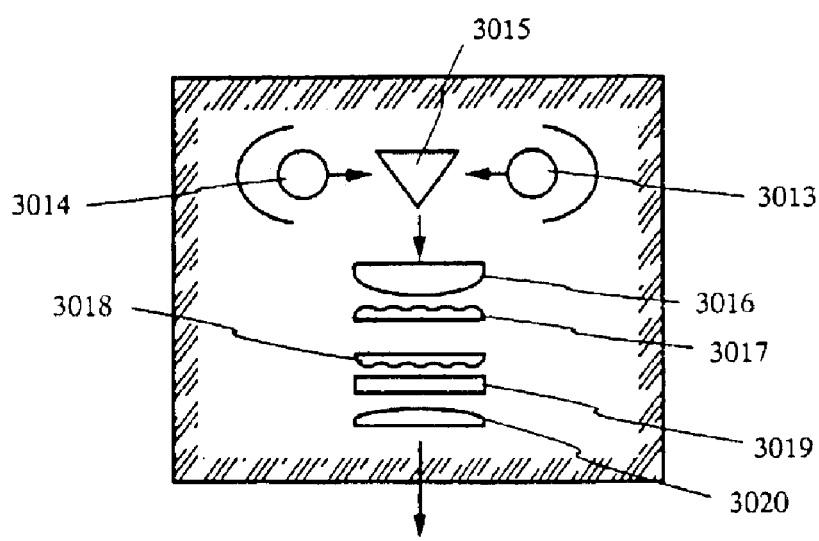

FIGS. 25A and 25B show details of the optical engine to be used for the rear projector (shown in FIG. 23E) and the front projector (shown in FIG. 23F). Incidentally, FIG. 25A shows the optical engine, and FIG. 25B shows the light source optical system contained in the optical engine.

The optical engine shown in FIG. 25A is made up of the light source optical system 3001, mirrors 3002, 3005–3007, dichroic mirrors 3003, 3004, optical lenses 3008a–3008c, prism 3011, liquid crystal display device 3010, and projection optical system 3012. The projection optical system 3012 has the projection lens. The one shown in this embodiment is of three-plate type with three sets of liquid crystal display device 3010. A single-plate type may also be acceptable. The optical paths indicated by arrows in FIG. 25A permit optical lens or film to be placed therein. The film may be one which has a polarizing function or which adjusts phase difference. The film may also be IR film.

As shown in FIG. 25B, the light source optical system 3001 is made up of the light sources 3013 and 3014, synthetic prism 3015, collimator lenses 3016 and 3020, lens arrays 3017 and 3018, and polarization conversion element 3019. Incidentally, the light source optical system shown in FIG. 25B has two light sources; however, one light source will suffice or three light sources will be acceptable. The optical path in the light source optical system may be provided with any of optical lens, film having a polarizing function, film to adjust phase difference, and IR film.

As mentioned above, the present invention finds a very wide range of applications and can be used electric appliances of any kind. The electric appliances in this embodiment will be realized by any combination of the structure shown in Embodiments 1 to 20.

The present invention permits one to produce TFT which has two gate insulating films with different thicknesses on the same substrate. Therefore, when applied to electro-optical devices (typically AM-LCD) or electric appliances having such electro-optical device as the display, the present invention makes it possible to arrange adequate circuits according to specifications and required performance. Therefore, it greatly improves the performance and reliability of semiconductor devices.

According to the present invention, the dielectric for a storage capacitance can be made thin in the pixel portion of the electro-optical device. In other words, a large storage capacitance can be formed in a small area. In addition, the storage capacitance can be hidden under the gate wiring and source wiring. This makes it possible to secure a sufficient storage capacitance without decreasing the aperture ratio in electro-optical device with a diagonal smaller than 1 inch.

What is claimed is:

1. A method for producing a semiconductor device including a plurality of pixels, each of the plurality of pixels including a pixel TFT and a storage capacitance, said method comprising the steps of:
 forming a light blocking film over a substrate;
 forming an electrode from a same material as the light blocking film over the substrate;
 forming a first insulating film covering the light blocking film and the electrode;
 etching the first insulating film to form an opening on the electrode;
 forming a second insulating film covering the first insulating film and the opening; and
 forming a semiconductor film on the second insulating film.

2. A method for producing a semiconductor device including a driving circuit portion and a pixel portion, said pixel portion having a plurality of pixels, each of the plurality of pixels including a pixel TFT and a storage capacitance, said method comprising the steps of:
 forming a light blocking film over a substrate;
 forming an electrode from a same material as the light blocking film over the substrate;
 forming a first insulating film that covering the light blocking film and the electrode;
 etching the first insulating film to form an opening on the electrode;
 forming a second insulating film covering the first insulating film and the opening;
 forming a semiconductor film on the second insulating film;
 forming a gate insulating film covering the semiconductor film;
 etching a portion of the gate insulating film to expose a semiconductor film of the driving circuit portion and a portion of a semiconductor film of the pixel portion;
 thermally oxidizing to form a thermal oxide film on a surface of the exposed semiconductor film of the driving portion and the exposed portion of the semiconductor film of the pixel portion.

3. A method for producing a semiconductor device including a driving circuit portion and a pixel portion, said pixel portion having a plurality of pixels, each of the plurality of pixels including a pixel TFT and a storage capacitance, said method comprising the steps of:
 forming a light blocking film over a substrate;
 forming an electrode from a same material as the light blocking film over the substrate;

forming a first insulating film covering the light blocking film and the electrode;

etching the first insulating film to form an opening on the electrode;

forming a second insulating film covering the first insulating film and the opening;

forming a semiconductor film on the second insulating film;

forming a gate insulating film covering the semiconductor film;

etching a portion of said gate insulating film to expose a semiconductor film of the driving circuit portion and a portion of a semiconductor film of the pixel portion;

thermally oxidizing to form a thermal oxide film on a surface of the exposed semiconductor film of the driving circuit portion and the exposed portion of the semiconductor of the pixel portion;

forming at least a first LDD region in the semiconductor film of the driving circuit portion and at least a second LDD region in the semiconductor film of the pixel portion, wherein the first LDD region in the driving circuit portion has a different length from the second LDD region in the pixel portion.

4. A method according to claim 2, wherein an interface between the second insulating film and the semiconductor film is formed without exposing to air.

5. A method according to claim 2, wherein the second insulating film has a thickness smaller than $1/5$ of a total thickness of the first insulating film and the second insulating film.

6. A method according to claim 3, wherein an interface between the second insulating film and the semiconductor film is formed without exposing to air.

7. A method according to claim 3, wherein the second insulating film has a thickness smaller than $1/5$ of a total thickness of the first insulating film and the second insulating film.

* * * * *